United States Patent
Osame et al.

(10) Patent No.: US 8,026,877 B2
(45) Date of Patent: *Sep. 27, 2011

(54) ELEMENT SUBSTRATE AND LIGHT-EMITTING DEVICE

(75) Inventors: Mitsuaki Osame, Kanagawa (JP); Aya Anzai, Kanagawa (JP); Yu Yamazaki, Tokyo (JP); Ryota Fukumoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 899 days.

This patent is subject to a terminal disclaimer.

(21) Appl. No.: 10/807,545

(22) Filed: Mar. 24, 2004

(65) Prior Publication Data

US 2005/0012686 A1    Jan. 20, 2005

(30) Foreign Application Priority Data

Mar. 26, 2003  (JP) ................................. 2003-086500
May 16, 2003   (JP) ................................. 2003-139560
Jun. 18, 2003  (JP) ................................. 2003-174134

(51) Int. Cl.
*G09G 3/32* (2006.01)
(52) U.S. Cl. .............. 345/82; 345/76; 345/92; 345/211; 315/169.3
(58) Field of Classification Search ............ 345/76–84, 345/55, 62, 204, 87–104, 211; 315/169.1–169.4; 313/498–500, 505
See application file for complete search history.

(56) References Cited

U.S. PATENT DOCUMENTS

| | | | |
|---|---|---|---|
| 4,507,759 A | 3/1985 | Yasui et al. |
| 5,247,190 A | 9/1993 | Friend et al. |
| 5,311,115 A | 5/1994 | Archer |
| 5,399,502 A | 3/1995 | Friend et al. |
| 5,517,207 A | 5/1996 | Kawada et al. |
| 5,615,027 A | 3/1997 | Kuribayashi et al. |
| 5,684,365 A | 11/1997 | Tang et al. |
| 5,764,206 A | 6/1998 | Koyama et al. |
| 5,814,834 A | 9/1998 | Yamazaki et al. |
| 5,898,235 A | 4/1999 | McClure |
| 5,949,483 A | 9/1999 | Fossum et al. |
| 5,986,463 A | 11/1999 | Takiguchi |
| 5,990,629 A | 11/1999 | Yamada et al. |
| 6,091,203 A | 7/2000 | Kawashima et al. |

(Continued)

FOREIGN PATENT DOCUMENTS

CN       1304182       7/2001

(Continued)

OTHER PUBLICATIONS

Mayumi Mizukami et al.; "36.1: 6-Bit Digital VGA OLED"; *SID 00 Digest*; pp. 912-915; 2000.

(Continued)

*Primary Examiner* — Seokyun Moon
(74) *Attorney, Agent, or Firm* — Fish & Richardson P.C.

(57) ABSTRACT

A potential of a gate of a driving transistor is fixed, and the driving transistor is operated in a saturation region, so that a current is supplied thereto anytime. A current control transistor operating in a linear region is disposed serially with the driving transistor, and a video signal for transmitting a signal of emission or non-emission of the pixel is input to a gate of the current control transistor via a switching transistor.

41 Claims, 23 Drawing Sheets

U.S. PATENT DOCUMENTS

| | | | |
|---|---|---|---|
| 6,124,840 A | 9/2000 | Kwon | |
| 6,166,768 A | 12/2000 | Fossum et al. | |
| 6,207,969 B1* | 3/2001 | Yamazaki | 257/49 |
| 6,246,180 B1 | 6/2001 | Nishigaki | |
| 6,246,384 B1* | 6/2001 | Sano | 345/76 |
| 6,452,153 B1 | 9/2002 | Lauxtermann et al. | |
| 6,475,845 B2 | 11/2002 | Kimura | |
| 6,515,310 B2 | 2/2003 | Yamazaki et al. | |
| 6,542,222 B1 | 4/2003 | Tsuji et al. | |
| 6,580,094 B1 | 6/2003 | Yamazaki et al. | |
| 6,583,775 B1 | 6/2003 | Sekiya et al. | |
| 6,583,776 B2 | 6/2003 | Yamazaki et al. | |
| 6,593,691 B2 | 7/2003 | Nishi et al. | |
| 6,611,108 B2 | 8/2003 | Kimura | |
| 6,661,180 B2 | 12/2003 | Koyama | |
| 6,693,301 B2 | 2/2004 | Takemura | |
| 6,707,068 B2 | 3/2004 | Fujimoto et al. | |
| 6,714,178 B2 | 3/2004 | Koyama et al. | |
| 6,730,966 B2 | 5/2004 | Koyama | |
| 6,734,836 B2 | 5/2004 | Nishitoba | |
| 6,753,654 B2 | 6/2004 | Koyama | |
| 6,774,574 B1 | 8/2004 | Koyama | |
| 6,777,887 B2 | 8/2004 | Koyama | |
| 6,787,807 B2 | 9/2004 | Yamazaki et al. | |
| 6,809,343 B2 | 10/2004 | Yamazaki et al. | |
| 6,828,587 B2 | 12/2004 | Yamazaki et al. | |
| 6,872,604 B2 | 3/2005 | Yamazaki et al. | |
| 6,879,110 B2 | 4/2005 | Koyama | |
| 6,900,861 B2 | 5/2005 | Yasui | |
| 6,903,731 B2 | 6/2005 | Inukai | |
| 6,906,344 B2 | 6/2005 | Yamazaki et al. | |
| 6,914,390 B2 | 7/2005 | Koyama | |
| 6,933,533 B2 | 8/2005 | Yamazaki et al. | |
| 6,953,951 B2 | 10/2005 | Yamazaki et al. | |
| 6,958,489 B2 | 10/2005 | Kimura | |
| 6,972,743 B2 | 12/2005 | Kim et al. | |
| 6,982,462 B2 | 1/2006 | Koyama | |
| 7,012,290 B2 | 3/2006 | Kimura | |
| 7,053,890 B2 | 5/2006 | Inukai | |
| 7,057,655 B1 | 6/2006 | Masuyama | |
| 7,061,451 B2 | 6/2006 | Kimura | |
| 7,106,006 B2 | 9/2006 | Koyama | |
| 7,122,969 B2* | 10/2006 | Fukumoto et al. | 315/169.3 |
| 7,129,917 B2 | 10/2006 | Yamazaki et al. | |
| 7,129,918 B2 | 10/2006 | Kimura | |
| 7,141,934 B2* | 11/2006 | Osame et al. | 315/169.3 |
| 7,154,119 B2 | 12/2006 | Yamazaki et al. | |
| 7,158,104 B2 | 1/2007 | Koyama | |
| 7,173,586 B2* | 2/2007 | Osame et al. | 345/82 |
| 7,187,350 B2* | 3/2007 | Yoshida | 345/76 |
| 7,209,101 B2 | 4/2007 | Abe | |
| 7,242,376 B2 | 7/2007 | Yamashita et al. | |
| 7,279,752 B2 | 10/2007 | Yamazaki et al. | |
| 7,336,035 B2 | 2/2008 | Koyama | |
| 7,358,531 B2 | 4/2008 | Koyama | |
| 7,358,942 B2 | 4/2008 | Yamazaki et al. | |
| 7,445,946 B2 | 11/2008 | Yamazaki et al. | |
| 7,535,022 B2 | 5/2009 | Yamazaki et al. | |
| 7,592,652 B2 | 9/2009 | Kimura | |
| 7,719,498 B2 | 5/2010 | Koyama | |
| 2001/0002703 A1 | 6/2001 | Koyama | |
| 2001/0017618 A1 | 8/2001 | Azami | |
| 2001/0022565 A1 | 9/2001 | Kimura | |
| 2001/0035849 A1 | 11/2001 | Kimura et al. | |
| 2002/0005825 A1 | 1/2002 | Lee et al. | |
| 2002/0101394 A1 | 8/2002 | Anzai | |
| 2002/0113760 A1* | 8/2002 | Kimura | 345/82 |
| 2002/0135312 A1* | 9/2002 | Koyama | 315/169.3 |
| 2002/0145582 A1 | 10/2002 | Yamazaki et al. | |
| 2002/0196212 A1 | 12/2002 | Nishitoba et al. | |
| 2002/0196389 A1 | 12/2002 | Koyama | |
| 2003/0020969 A1 | 1/2003 | Kimura | |
| 2003/0045043 A1 | 3/2003 | Koyama | |
| 2003/0058687 A1 | 3/2003 | Kimura | |
| 2003/0067424 A1* | 4/2003 | Akimoto et al. | 345/55 |
| 2003/0090447 A1 | 5/2003 | Kimura | |
| 2003/0112352 A1 | 6/2003 | Tanaka | |
| 2003/0117352 A1 | 6/2003 | Kimura | |
| 2003/0137503 A1 | 7/2003 | Kimura et al. | |
| 2003/0164685 A1 | 9/2003 | Inukai | |
| 2003/0222589 A1 | 12/2003 | Osame et al. | |
| 2003/0234392 A1 | 12/2003 | Kung et al. | |
| 2004/0003939 A1 | 1/2004 | Nishi et al. | |
| 2004/0041750 A1 | 3/2004 | Abe | |
| 2004/0041752 A1 | 3/2004 | Kimura | |
| 2004/0188761 A1 | 9/2004 | Koyama | |
| 2004/0189214 A1 | 9/2004 | Osame et al. | |
| 2004/0207615 A1 | 10/2004 | Yumoto | |
| 2004/0251953 A1* | 12/2004 | Yamazaki et al. | 327/512 |
| 2004/0252565 A1* | 12/2004 | Yamazaki et al. | 365/202 |
| 2004/0263506 A1 | 12/2004 | Koyama et al. | |
| 2004/0263741 A1 | 12/2004 | Koyama et al. | |
| 2005/0012686 A1 | 1/2005 | Osame et al. | |
| 2005/0162354 A1 | 7/2005 | Osame et al. | |
| 2006/0033161 A1 | 2/2006 | Koyama | |
| 2006/0286889 A1 | 12/2006 | Nishi et al. | |
| 2007/0007527 A1 | 1/2007 | Koyama | |
| 2007/0052634 A1 | 3/2007 | Yamazaki et al. | |
| 2007/0085783 A1 | 4/2007 | Koyama | |
| 2007/0085796 A1 | 4/2007 | Osame et al. | |
| 2007/0115223 A1 | 5/2007 | Kimura | |
| 2007/0139315 A1 | 6/2007 | Abe | |
| 2007/0241992 A1 | 10/2007 | Fukumoto et al. | |
| 2008/0001193 A1 | 1/2008 | Hagihara et al. | |
| 2008/0029765 A1 | 2/2008 | Yamazaki et al. | |
| 2008/0265786 A1 | 10/2008 | Koyama | |
| 2009/0072757 A1 | 3/2009 | Yamazaki et al. | |
| 2009/0315066 A1 | 12/2009 | Kimura | |
| 2011/0109604 A1 | 5/2011 | Yamazaki et al. | |

FOREIGN PATENT DOCUMENTS

| | | |
|---|---|---|
| EP | 561469 A | 9/1993 |
| EP | 717446 A | 6/1996 |
| EP | 810732 A2 | 12/1997 |
| EP | 1 061 497 | 12/2000 |
| EP | 1063630 A2 | 12/2000 |
| EP | 1 096 571 A2 | 5/2001 |
| EP | 1 107 220 | 6/2001 |
| EP | 1 109 225 A2 | 6/2001 |
| EP | 1 139 454 A2 | 10/2001 |
| EP | 1 148 467 A2 | 10/2001 |
| EP | 1178462 A | 2/2002 |
| EP | 1 288 902 | 3/2003 |
| JP | 2041113 B | 9/1990 |
| JP | 6013820 A | 1/1994 |
| JP | 6216727 A | 8/1994 |
| JP | 8115136 A | 5/1996 |
| JP | 8234683 A | 9/1996 |
| JP | 09-162414 | 3/1997 |
| JP | 09-162414 | 6/1997 |
| JP | 9168119 A | 6/1997 |
| JP | 09-270518 | 10/1997 |
| JP | 9321596 A | 12/1997 |
| JP | 10-092576 | 4/1998 |
| JP | 10214487 A | 8/1998 |
| JP | 10-239665 | 9/1998 |
| JP | 11-176521 | 7/1999 |
| JP | 11282419 A | 10/1999 |
| JP | 2000-227776 A | 8/2000 |
| JP | 2000221942 A | 8/2000 |
| JP | 2000252426 A | 9/2000 |
| JP | 2001005426 A | 1/2001 |
| JP | 2001-195016 A | 7/2001 |
| JP | 2001-236027 A | 8/2001 |
| JP | 2001-306031 A | 11/2001 |
| JP | 2001-318627 A | 11/2001 |
| JP | 2001-324958 | 11/2001 |
| JP | 2002082651 A | 3/2002 |
| JP | 2002108285 A | 4/2002 |
| JP | 2002124377 A | 4/2002 |
| JP | 2002-149112 | 5/2002 |
| JP | 2002-278497 | 9/2002 |
| JP | 2002-323873 | 11/2002 |
| JP | 2002333862 A | 11/2002 |
| JP | 2002-351357 | 12/2002 |
| JP | 2002-358031 | 12/2002 |
| JP | 2003-008719 A | 1/2003 |

| | | | |
|---|---|---|---|
| JP | 2003-043999 A | 2/2003 | |
| JP | 2003-051599 A | 2/2003 | |
| JP | 2003-058107 | 2/2003 | |
| JP | 2003059650 A | 2/2003 | |
| JP | 2003295793 A | 10/2003 | |
| JP | 2003323154 A | 11/2003 | |
| JP | 2004333594 A | 11/2004 | |
| TW | 508837 B | 11/2002 | |
| TW | 521226 B | 2/2003 | |
| TW | 521237 B | 2/2003 | |
| WO | WO-90/13148 | 11/1990 | |
| WO | WO 03-027997 | 4/2003 | |
| WO | WO2004021326 A1 | 3/2004 | |

OTHER PUBLICATIONS

Kazutaka Inukai et al.; "36.4L: *Late-News Paper*: 4.0-in. TFT-OLED Displays and a Novel Digital Driving Method"; *SID 00 Digest*; pp. 924-927; 2000.

International Search Report (Application No. PCT/JP2004/003546 in Japanese), 7 pages, May 11, 2004.

Written Opinion (Application No. PCT/JP2004/003546 in Japanese), partial English translation, 6 pages, May 11, 2004.

Chinese Office Action for Application No. 200480007698.4 dated Sep. 14, 2007 with English translation, 17 pages.

Schenk et al., "Polymers for Light Emitting Diodes," Eurodisplay '99: Proceedings of the 19th IDRC (International Display Research Conference Proceedings), Sep. 6, 1999, pp. 33-37.

Tsutsui et al., "Electroluminescence in Organic Thin Films," Photochemical Processes in Organized Molecular Systems, 1991, pp. 437-450.

Baldo et al., "Highly Efficient Phosphorescent Emission From Organic Electroluminescent Devices," Nature, Sep. 10, 1998, vol. 395, pp. 151-154.

Baldo et al., "Very High-Efficiency Green Organic Light-Emitting Devices Based on Electrophosphorescence," Appl. Phys. Lett. (Applied Physics Letters), Jul. 5, 1999, vol. 75, No. 1, pp. 4-6.

Tsutsui et al., "High Quantum Efficiency in Organic Light-Emitting Devices With Iridium-Complex as a Triplet Emissive Center," Jpn. J. Appl. Phys. (Japanese Journal of Applied Physics), Dec. 15, 1999, vol. 38/Part.2, No. 12B, pp. L1502-L1504.

Kimura et al., "TFT-LEPD With Image Uniformity by Area Ratio Gray Scale," Eurodisplay '99: Proceedings of the 19th IDRC (International Display Research Conference), Sep. 6, 1999, pp. 71-74.

Shimoda et al., "Technology for Active Matrix Light Emitting Polymer Displays," IEDM 99: Technical Digest of International Electron Devices Meeting, 1999, pp. 107-110.

Shimoda et al., "Current Status and Future of Light-Emitting Polymer Display Driven by Poly-Si TFT," SID Digest '99 : SID International Symposium Digest of Technical Papers, May 18, 1999, pp. 372-375.

Han et al., "3.8inch Green OLED With Low Temperature Poly SI TFT," Eurodisplay '99: Proceedings of the 19th IDRC (International Display Research Conference) Late-News Papers, Sep. 6, 1999, pp. 27-30.

Kimura et al., "Low-Temperature Poly-SI TFT Driven Light-Emitting-Polymer Displays and Digital Gray Scale for Uniformity," IDW '99 : Proceedings of the 6th International Display Workshops, 1999, pp. 171-174.

Shimoda et al., "High Resolution Light Emitting Polymer Display Driven by Low Temperature Polysilicon Thin Film Transistor With Integrated Driver," Asia Display '98 : Proceedings of the 18th IDRC (International Display Research Conference), 1998, pp. 217-220.

Yadid-Pecht et al., "Wide Dynamic Range APS Star Tracker," Solid State Sensor Arrays and CCD Cameras (Proceedings. SPIE—The International Society for Optical Engineering), 1996, vol. 2654, pp. 82-92.

Yang et al., "A 640x512 CMOS Image Sensor With Ultra Wide Dynamic Range Floating-Point Pixel-Level ADC," ISSCC 99 (Digest of Technical Papers. IEEE International Solid-State Circuits Conference), 1999, pp. 308-309.

European Search Report (European Patent Application No. 04721308.7) dated Mar. 24, 2009, 3 pages.

Office Action, Taiwanese Application No. 93107497, dated Jun. 27, 2011, 10 pages with English translation.

* cited by examiner

ELEMENT SUBSTRATE AND LIGHT-EMITTING DEVICE

TECHNICAL FIELD

The present invention relates to a light-emitting device in which each of pixels is provided with a light-emitting element and a means for supplying a current to the light-emitting element and an element substrate.

BACKGROUND ART

A light-emitting element is high in visibility and optimum for low profiling since it emits light and does not require any backlight which is required in a liquid crystal display device (LCD), and that has no limitation in visual angle. Therefore, in recent years, a light-emitting device using the light-emitting element has attracted attention as a display device alternative to a CRT and the LCD. In addition, as used herein, the light-emitting element means an element whose luminosity is controlled by a current or a voltage, and an OLED (Organic Light Emitting Diode), an MIM type electron source element (electron emitting element) used in and an FED (Field Emission Display), and the like are fall within the definition.

The light-emitting device includes a panel and a module having an IC or the like including a controller mounted on the panel. This invention also relates to an element substrate equivalent to one mode achieved before a completion of the panel in a process of manufacturing the light-emitting device, and each of pixels in the element substrate is provided with a means for supplying a current to the light-emitting element.

The OLED (Organic Light Emitting Diode) which is a variation of the light-emitting element has a layer comprising an electro-luminescent material capable of obtaining luminescence (electro-luminescence) generated upon application of an electric field (hereinafter referred to as an electro-luminescent layer), an anode layer, and a cathode layer. The electro-luminescent layer is provided between the anode and the cathode and constituted of a layer or a plurality of layers. In some cases, an inorganic compound is contained in the layer or layers. A light emission (fluorescence) generated when a singlet excitation state returns to a ground state and a light emission (phosphorescence) generated when a triplet excitation state returns to a ground state are included in the luminescence in the electro-luminescent layer.

Hereinafter, a structure of a pixel of an ordinary light-emitting device and driving of the pixel will be described briefly. The pixel shown in FIG. 7 has a switching transistor 700, a driving transistor 701, a capacitance element 702, and a light-emitting element 703. A gate of the switching transistor 700 is connected to a scan line 705, and a source thereof is connected to a signal line 704 when a drain thereof is connected to a gate of the driving transistor 701. A source of the driving transistor 701 is connected to a power line 706, and a drain thereof is connected to an anode of the light-emitting element 703. A cathode of the light-emitting element 703 is connected to a counter electrode 707. The capacitance element 702 is provided in such a manner as to retain a potential difference between the gate and the source of the driving transistor 701. Predetermined voltages are applied separately to the power line 706 and the counter electrode 707, so that the power line 706 and the counter electrode 707 have a potential difference therebetween.

When the switching transistor 700 is turned on by a signal from the scan line 705, a video signal input to the signal line 704 is input to the gate of the driving transistor 701. A potential difference between a potential of the input video signal and the power line 706 becomes a gate/source voltage Vgs, so that a current is supplied to the light-emitting element 703 to cause the light-emitting element 703 to emit light.

DISCLOSURE OF THE INVENTION

Problems that the Invention is to Solve

Incidentally, since a transistor using polysilicon, for example, is suitably used as a transistor of the light-emitting device since it has a high field effect mobility and a large on-current. In turn, the transistor using polysilicon has a drawback that a variation in characteristics tends to occur due to a defect formed in a grain boundary.

Referring to the pixel shown in FIG. 7, when drain currents of the driving transistors 701 vary pixel by pixel, irregularity in luminosity of the light-emitting elements 703 undesirably occurs because the drain currents of the driving transistor 701 vary depending on the pixels.

As a measure for suppressing the variation in drain currents, a method of increasing an L/W (L: channel length, W: channel width) of the driving transistor 701 proposed in Japanese Patent Application No. 2003-008719 is known. The drain current Ids in a saturation area of the driving transistor 701 is given by the following equation (1).

$$Ids = \beta(Vgs - Vth)^2/2 \qquad (1)$$

From the equation (1), since the drain current Ids in the saturation area of the driving transistor 701 influences greatly on the current flowing when there is a slightest change in Vgs, a precaution must be taken so as to prevent the voltage Vgs retained between the gate and the source of the driving transistor 701 from being changed during the light emission of the light-emitting element 703. Therefore, it is necessary to increase capacitance of the capacitance element 702 provided between the gate and the source of the driving transistor 701 and to suppress an off-current of the switching transistor 700 as low as required.

Achievement of both of the suppression of the off-current of the switching transistor 700 and the increase in the on-current for charging large capacitance is a difficult task in a transistor manufacturing process.

Also, there is a problem that Vgs of the driving transistor 701 is changed by a switching of the switching transistor 700, a change in potential of the signal line or the scan line, and so forth. The problem is attributable to stray capacitance at the gate of the driving transistor 701.

In view of the above problems, an object of this invention is to provide a light-emitting device which does not require the suppression of an off-current of the switching transistor 700 nor the increase in capacitance of the capacitance element 702 and is less subject to the influence of the stray capacitance and capable of suppressing irregularity in luminosity of light-emitting elements 703 of pixels and an element substrate.

Means for Solving the Problems

In this invention, a potential of a gate of a driving transistor is fixed, and the driving transistor is operated in a saturation area so that a current is supplied thereto anytime. A current control transistor operating in a linear area is provided serially with the driving transistor, and a video signal for transmitting a signal of emission or non-emission of a pixel is input to a gate of the current control transistor via a switching transistor.

A source/drain voltage Vds of the current control transistor is small since the current control transistor is operated in the linear area, and a slightest change in the gate/source voltage Vgs of the current control transistor does not influence on the current flowing to the light-emitting element. The current flowing to the light-emitting element is decided by the driving transistor operating in the saturation area.

Advantage of the Invention

It is possible to avoid the influences to be otherwise exerted on the current flowing to the light-emitting element without increasing the capacitance of the capacitance element provided between the gate and the source of the current control transistor and suppressing an off-current of the switching transistor. Further, the current is free from the influence of stray capacitance at the gate of the current control transistor. Therefore, it is possible to reduce the variation factors to greatly increase image quality.

Also, since it is unnecessary to suppress the off-current of the switching transistor, it is possible to simplify a transistor manufacturing process to contribute to a cost reduction and an improvement in yield.

BEST MODE FOR CARRYING OUT THE INVENTION

Hereinafter, embodiments of this invention will be described with reference to the drawings. Note that this invention can be carried out as various different embodiments, and those skilled in the art will readily understand that it is possible to modify modes and details of the embodiments without departing from the sprit and the scope of the invention.

Embodiment 1

Figure 1:
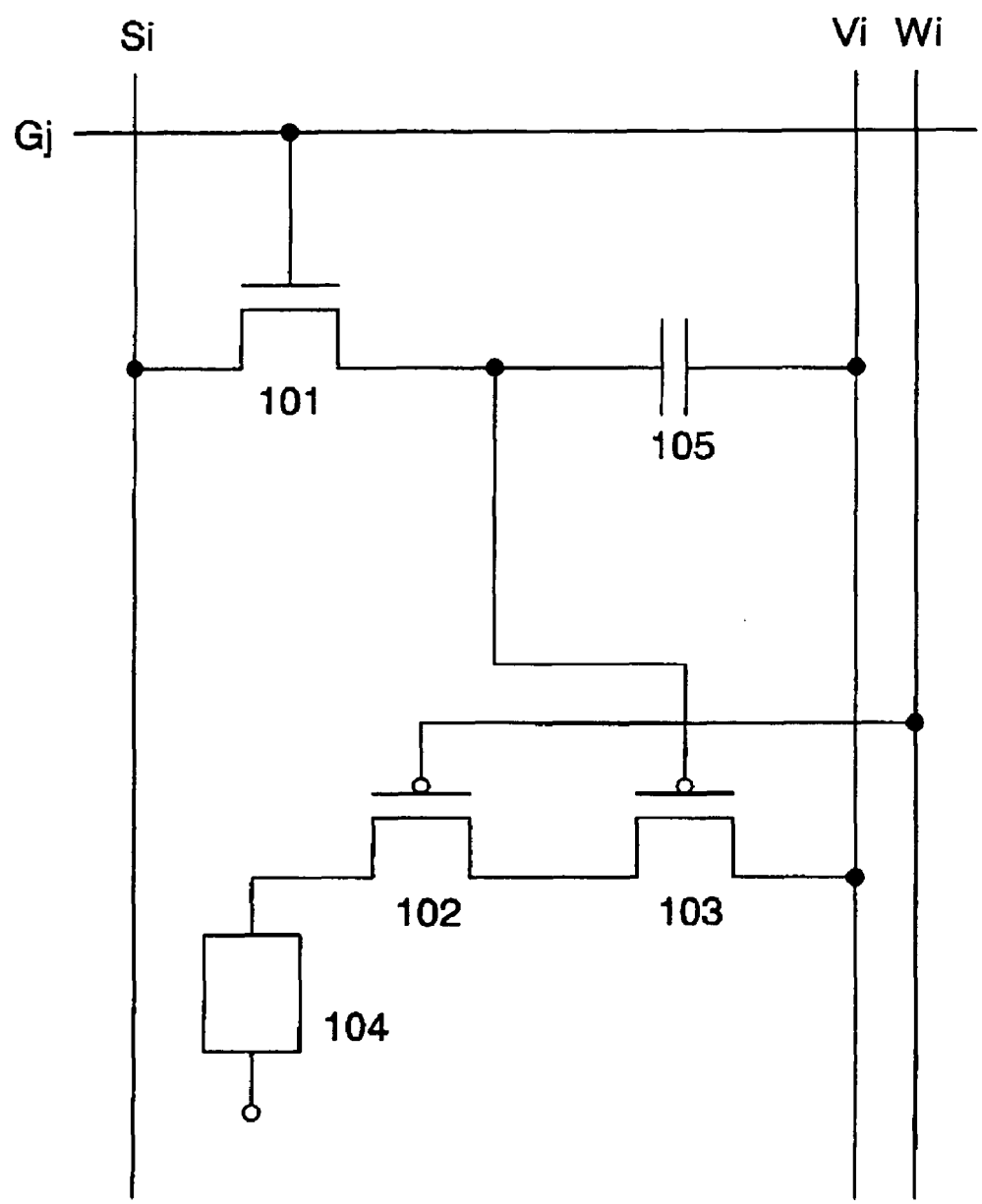
FIG. 1 is a diagram showing one embodiment of this invention.

One embodiment of a pixel included in a light-emitting device of this invention is shown in FIG. 1. The pixel shown in FIG. 1 has a transistor (switching transistor) 101 used as a switching element for controlling an input of a video signal to the pixel, and a driving transistor 102 for controlling a value of a current flowing to a light-emitting element 104, and a current control transistor 103 for controlling a supply of the current to the light-emitting element 104. The pixel may be provided with a capacitance element 105 for maintaining a potential of the video signal, as is the case with this embodiment.

The driving transistor 102 and the current control transistor 103 are identical in conductivity. In this invention, the driving transistor 102 is operated in a saturation area while the current control transistor 103 is operated in a linear area.

Further, an L of the driving transistor 102 may be longer than a W thereof, and an L of the current control transistor 103 may be equal to or shorter than a W thereof. More preferably, a ratio of the L of the driving transistor 102 to the W thereof may be 5 or more. Also, when L1/W1: L2/W2=X:1 holds (wherein, a channel length of the driving transistor 102, a channel width of the driving transistor 102, a channel length of the current control transistor 103 and a channel width of the current control transistor 103 are represented by L1, W1, L2, and W2), it is preferable to keep X in the range of 5 to 6,000. For instance, L1/W1=500 μm/3 μm, and L2/W2=3 μm/100 μm.

Either one of an enhancement transistor or a depletion transistor may be used as the driving transistor 102.

Also, either one of an N-type transistor or a P-type transistor may be used as the switching transistor 101.

A gate of the switching transistor 101 is connected to a scan line Gj (j=1 to y). A source of the switching transistor 101 is connected to a signal line Si (i=1 to x) when a drain of the switching transistor 101 is connected to a gate of the current control transistor 103. A gate of the driving transistor 102 is connected to a second power line Wi (i=1 to x). The driving transistor 102 and the current control transistor 103 are connected to a first power line Vi (i=1 to x) and the light-emitting element 104 in such a manner that a current supplied from the first power line Vi (i=1 to x) is supplied to the light-emitting element 104 as a drain current for the driving transistor 102 and the current control transistor 103. In this embodiment, a source of the current control transistor 103 is connected to the first power line Vi (i=1 to x), and a drain of the driving transistor 102 is connected to a pixel electrode of the light-emitting element 104.

The source of the driving transistor 102 may be connected to the first power line Vi (i=1 to x), and the drain of the current control transistor 103 may be connected to the pixel of the light-emitting element 104.

The light-emitting element 104 is formed of an anode, a cathode, and an electro-luminescent layer provided therebetween. In the case where the anode is connected to the driving transistor 102 as shown in FIG. 1, the anode serves as the pixel electrode while the cathode serves as a counter electrode. A potential difference is set between the counter electrode of the light-emitting element 104 and the first power line Vi (i=1 to x) so that a current in a forward bias direction is supplied to the light-emitting element 104. In addition, the counter electrode is connected to a third power line.

The capacitance element 105 has two electrodes, one of which is connected to the first power line Vi (i=1 to x) and the other is connected to the gate of the current control transistor 103. The capacitance element 105 is provided for the purpose of maintaining a potential difference between the electrodes of the capacitance element 105 when the switching transistor 101 is in a non-selection state (off-state). Note that this invention is not limited to the constitution including the capacitance element 105 shown in FIG. 1, and it is possible to use a constitution which does not include the capacitance element 105.

In FIG. 1, the P-type transistors are used as the driving transistor 102 and the current control transistor 103 and the drain of the driving transistor 102 is connected to the anode of the light-emitting element 104. In the case of using N-type transistors as the driving transistor 102 and the current control transistor 103, the source of the driving transistor 102 is connected to the cathode of the light-emitting element 104. In this case, the cathode of the light-emitting element 104 serves as the pixel electrode and the anode thereof serves as the counter electrode.

Next, a method of driving the pixel shown in FIG. 1 will be described. Operation of the pixel shown in FIG. 1 can be divided into a write period and a data retention period.

When the scan line Gj (j=1 to y) is selected in the write period, the switching transistor 101 whose gate is connected to the scan line Gj (j=1 to y) is turned on. Then, a video signal is input to the signal line Si (i=1 to x) to be input to the gate of the current control transistor 103 via the switching transistor 101. Note that the driving transistor 102 is always in an on-state because its gate is connected to the first power line Vi (i=1 to x).

In the case where the current control transistor 103 is turned on by the video signal, a current is supplied to the light-emitting element 104 via the first power line Vi (i=1 to x). Here, since the current control transistor 103 operates in the linear area, the current flowing to the light-emitting element 104 is decided depending on the driving transistor 102 operating in the saturation area and a voltage/current characteristic of the light-emitting element 104. The light-emitting element 104 emits light having luminosity corresponding to the supplied current.

In the case where the current control transistor 103 is turned off by the video signal, no current is supplied to the light-emitting element 104 so that the light-emitting element 104 does not emit light.

In the data retention period, a potential of the scan line Gaj (j=1 to y) is so controlled as to turn off the switching transistor 101, so that a potential of the video signal written during the write period is maintained. Since the potential of the video signal is maintained by the capacitance element 105 in the case where the current control transistor 103 is turned on during the write period, the current supply to the light-emitting element 104 is maintained. In contrast, because the potential of the video signal is maintained by the capacitance element 105 when the current control transistor 103 is turned off during the write period, the current supply to the light-emitting element 104 is not performed.

An element substrate is equivalent to one mode achieved before a completion of a formation of the light-emitting element in the course of manufacturing the light-emitting device of this invention.

A transistor formed by using monocrystalline silicon, a transistor using an SOI, and a thin film transistor using polycrystalline silicon or amorphous silicon may be used as the transistors of this invention. A transistor using an organic semiconductor and a transistor using a carbon nanotube may also be used. Each of the transistors provided in the pixel of the light-emitting device of this invention may have a single gate structure, a double gate structure, or a multi-gate structure having more than 2 gate electrodes.

With the above-described constitution, the current control transistor 103 is operated in the linear area to achieve a small source/drain voltage Vds of the current control transistor 103, and a slight fluctuation in the gate/source voltage Vgs of the current control transistor 103 does not influence on the current flowing to the light-emitting element 104. The current flowing to the light-emitting element 104 is decided by the driving transistor 102 operating in the saturation area. Therefore, it is unnecessary to increase the capacitance of the capacitance element 105 provided between the gate and the source of the current control transistor 103 nor to suppress the off-current of the switching transistor 101 to keep the current flowing to the light-emitting element 104 free from adverse effects. Also, the current flowing to the light-emitting element 104 is free from adverse effects of stray capacitance at the gate of the current control transistor 103. Since the factors for fluctuation is thus reduced, it is possible to greatly increase image quality.

In addition, since the active matrix type light-emitting device is capable of maintaining the current supply to the light-emitting element for a certain period of time after the input of the video signal, it has flexibility toward a large size panel and high definition and is becoming a mainstream product for near future. Specific pixel structures of the active matrix type light-emitting devices which have been proposed vary depending light-emitting device manufactures, and each of them has its specific technical contrivance. Shown in FIG. 22 is a systematic illustration of types of driving methods of the active matrix type light-emitting device.

Figure 22:
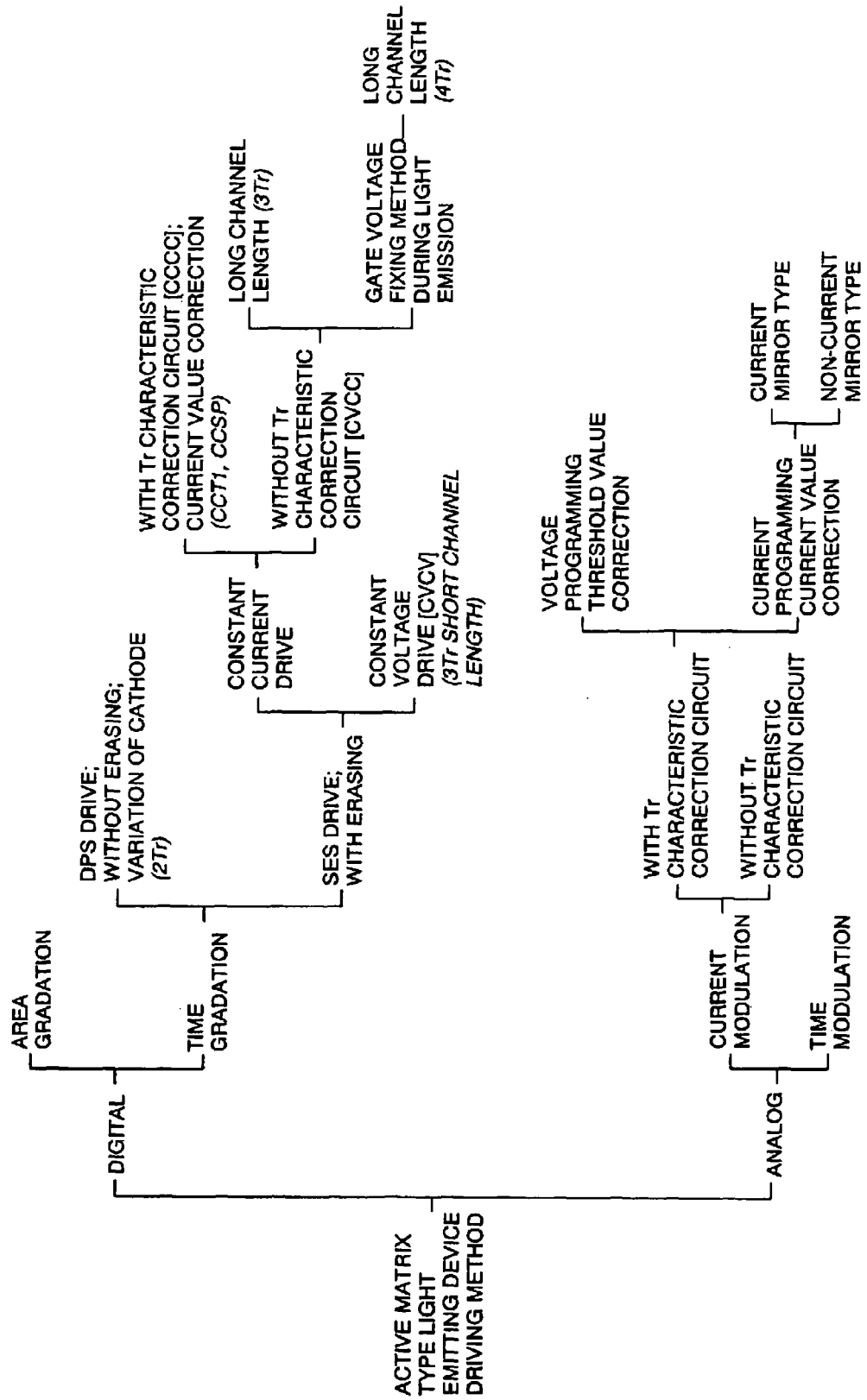
FIG. 22 is an illustration of driving methods of an active matrix type light-emitting device.

As shown in FIG. 22, the driving methods in the active matrix type light-emitting device are generally divided into those using a digital video signal and those using an analog video signal. The analog light-emitting devices are further divided into those using current modulation wherein a value of a current to be supplied to the light-emitting element is modulated in an analog manner and those using time modulation wherein gradation is expressed by changing a length of each of on and off of an inverter. The current modulation type light-emitting devices can be divided into those having a Tr characteristic correction circuit and those do not have the Tr characteristic correction circuit. The Tr characteristic correction circuit is a circuit for correcting a variation in characteristics of driving transistors, and some Tr characteristic correction circuits correct only a threshold value while other Tr characteristic correction circuits correct a current value (threshold value, mobility, and so forth).

The light-emitting devices having the Tr characteristic correction circuit classified into the current modulation type can be divided into those correcting the threshold value by voltage programming and those correcting the current value by current programming. The voltage programming is used for correcting a fluctuation in threshold value of the driving transistor. The current programming is used for correcting a fluctuation in current value (including threshold value, mobility, and so forth) of the driving transistor. The video signal is input by a current. The light-emitting element is a current driving element, and it is more straightforward to use the current value as date because light emission luminosity hinges upon the current.

The light-emitting devices correcting the current value by the current programming can be divided into those of a current mirror type and those do not use any current mirror. The current mirror type has a pixel circuit using a current mirror circuit, and a transistor for setting a current is provided separately from a transistor for supplying a current. Identical characteristics of the two transistors constituting a mirror are a major premise. The light-emitting device without current mirror does not use the current mirror circuit, and one transistor performs the current setting and the current supply.

The light-emitting devices classified into the digital light-emitting device can be divided into those of an area gradation and those of a time gradation. The area gradation is used for performing a gradation display by selecting among weights 1:2:4:8 and so forth set in light emission areas of sub-pixels provided in a pixel. The time gradation is used for performing a gradation display by selecting among weights 1:2:4:8 and so forth set in light emission periods of sub-frames provided in one frame.

The time gradation is divided into a DPS (Display Period Separated) driving and an SES (Simultaneous Erasing Scan) driving. In the DPS driving, the sub-frame is constituted of an addressing period and a lighting period. The DPS driving is disclosed in M. Mizukami et al., 6-Bit Digital VGA OLED, SID '00 Digest, p. 912. In the SES driving, it is possible to overlap the addressing period with the lighting period by using an erasing transistor, so that the lighting period of the light-emitting element is increased. The SES driving is disclosed in K. Inukai et al., 4.0-in. TFT-OLED Displays and a Novel Digital Driving Method, SID '00 Digest, p. 924.

The SES driving is divided into a constant current driving and a constant voltage driving. The constant current driving is used for driving a light-emitting element with a constant current, so that the constant current is supplied irrelevant from a change in resistance of the light-emitting element. The constant voltage driving is used for driving a light-emitting element with a constant voltage.

The light-emitting device of the constant current driving is divided into a light-emitting device with Tr characteristic correction circuit and a light-emitting device without Tr characteristic correction circuit. A light-emitting device (CCT1) driven by the method disclosed in PCT publication NO. WO 03/027997 and a light-emitting device (CCSP) driven by the method disclosed in Japanese Patent Application No. 2002-056555 are included in the light-emitting device with Tr characteristic correction circuit. The light-emitting device without Tr characteristic correction circuit is further divided into a long channel length driving Tr type and a fixed gate potential for light emission type. The long channel length driving Tr type is disclosed in Japanese Patent Application No. 2002-025065. The long channel length driving Tr type is used for suppressing a characteristics variation in driving transistors during the constant current driving. By greatly elongating the gate length, it is unnecessary to use Vgs near the threshold value, thereby suppressing a fluctuation in value of the current flowing to the light-emitting element of each of pixels.

The fixed gate potential for light emission is used for fixing a potential of a gate of a driving transistor during the light emission period of the light emission element at a value with which the driving transistor is turned on to keep Vgs of the driving transistor at a constant value, thereby improving display defect. Data are input to a gate of a current control transistor disposed serially with the driving transistor. There is a long channel length driving Tr type included among the light-emitting devices of the fixed gate potential for light emission type. The light-emitting device of this invention is classified under the long channel length driving Tr type using the fixed gate potential for light emission.

Figure 23:
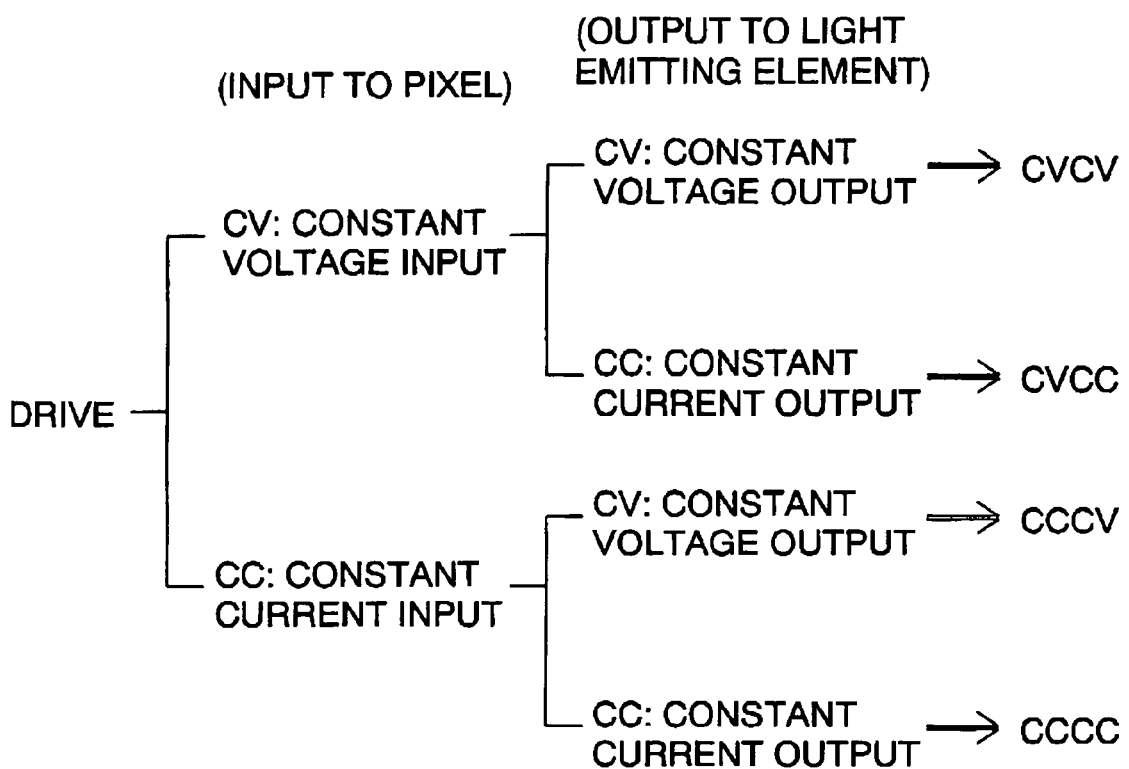
FIG. 23 is an illustration of driving methods classified according to a video signal using a voltage and a video signal using a current.

Shown in FIG. 23 is an illustration of driving methods classified according to a video signal using a voltage and a video signal using a current. As shown in FIG. 23, the driving methods are divided into those wherein a video signal to be input to the pixel is at a constant voltage (CV) in the light emission of the light-emitting element and those wherein a video signal to be input to the pixel is at a constant current (CC) in the light emission of the light-emitting element. Those wherein the video signal is the constant current (CV) are divided into a driving method wherein a voltage applied to the light-emitting element has a constant value (CVCV) and a driving method wherein a current applied to the light-emitting element has a constant value (CCCC).

Embodiment 2

In this embodiment, a mode of pixels provided in the light-emitting device of this invention, which is different from that of FIG. 1, will be described.

Figure 2:
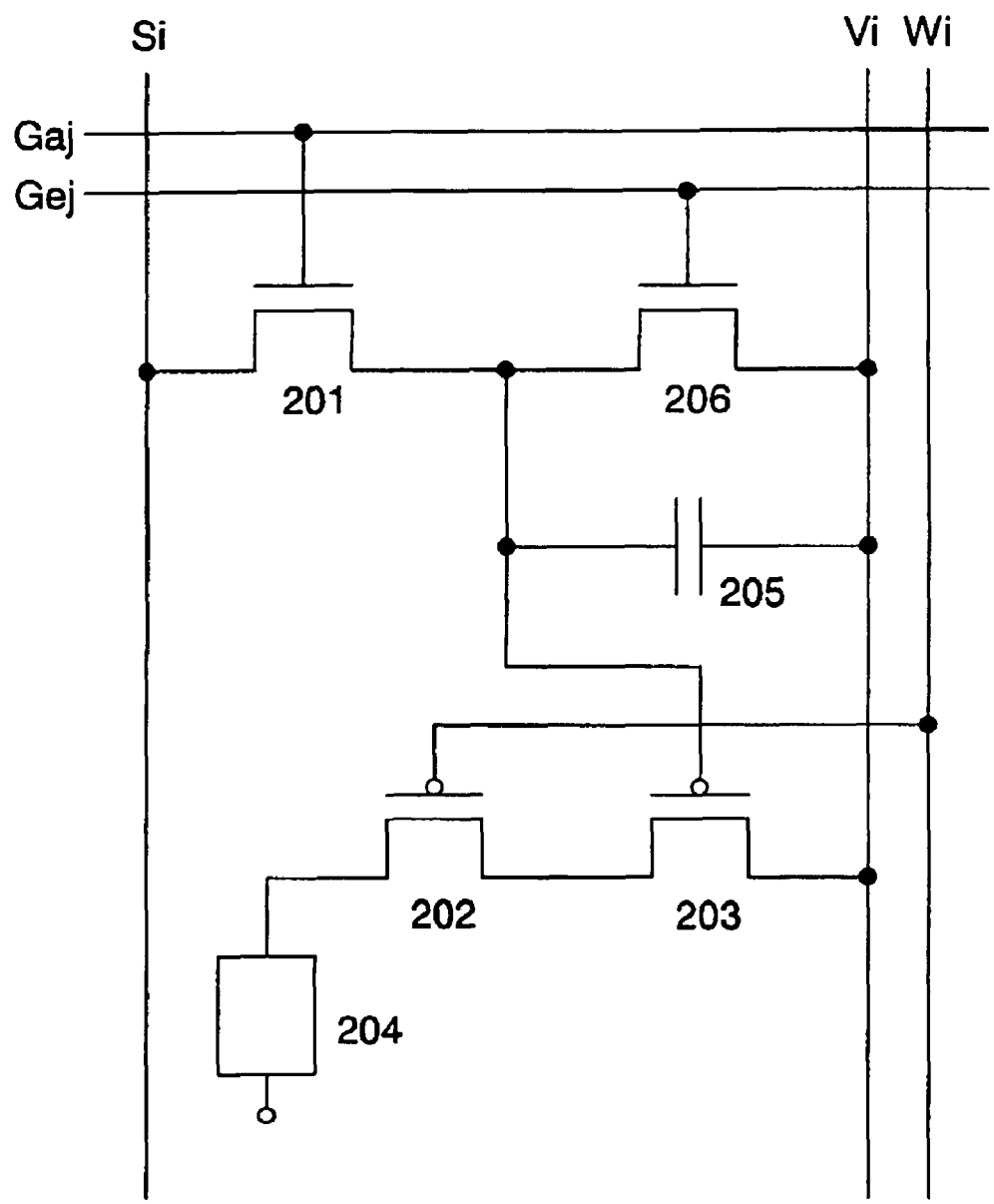
FIG. 2 is a diagram showing another embodiment of this invention.

A pixel shown in FIG. 2 has a light-emitting element 204, a switching transistor 201, a driving transistor 202, a current control transistor 203, and a transistor 206 (erasing transistor) for forcibly turning off the current control transistor 203. The pixel may be provided with a capacitance element 205 in addition to the above elements.

The driving transistor 202 and the current control transistor 203 are identical in conductivity. In this invention, the driving transistor 202 is operated in a saturation area while the current control transistor 203 is operated in a linear area.

Further, an L of the driving transistor 202 may be longer than a W thereof, and an L of the current control transistor 203 may be equal to or shorter than a W thereof. More preferably, a ratio of the L of the driving transistor 202 to the W thereof may be 5 or more.

Either one of an enhancement transistor or a depletion transistor may be used as the driving transistor 202.

Either one of an N-type transistor or a P-type transistor may be used as the switching transistor 201 and the erasing transistor 206.

A gate of the switching transistor 201 is connected to a first scan line Gaj (j=1 to y). A source of the switching transistor 201 is connected to a signal line Si (i=1 to x) when a drain of the switching transistor 201 is connected to a gate of the current control transistor 203. A gate of the erasing transistor 206 is connected to a second scan line Gej (j=1 to y), and a source thereof is connected to a first power line Vi (i=1 to x) when a drain thereof is connected to the gate of the current control transistor 203. A gate of the driving transistor 202 is connected to a second power line Wi (i=1 to x). The driving transistor 202 and the current control transistor 203 are connected to the first power line Vi (i=1 to x) and the light-emitting element 204 in such a manner that a current supplied from the first power line Vi (i=1 to x) is supplied to the light-emitting element 204 as a drain current of the driving transistor 202 and the current control transistor 203. In this embodiment, a source of the current control transistor 203 is connected to the first power line Vi (i=1 to x), and a drain of the driving transistor 202 is connected to a pixel electrode of the light-emitting element 204.

The source of the driving transistor 202 may be connected to the first power line Vi (i=1 to x), and the drain of the current control transistor 203 may be connected to the pixel electrode of the light-emitting element 204.

The light-emitting element 204 is formed of an anode, a cathode, and an electro-luminescent layer provided between the anode and the cathode. In the case where the anode is connected to the driving transistor 202 as shown in FIG. 2, the anode serves as the pixel electrode while the cathode serves as a counter electrode. A potential difference is set between the counter electrode of the light-emitting element 204 and the first power line Vi (i=1 to x) so that a current in a forward bias direction is supplied to the light-emitting element 204. In addition, the counter electrode is connected to a third power line.

The capacitance element 205 has two electrodes, one of which is connected to the first power line Vi (i=1 to x) and the other is connected to the gate of the current control transistor 203.

In FIG. 2, P-type transistors are used as the driving transistor 202 and the current control transistor 203, and the drain of the driving transistor 202 is connected to the anode of the light-emitting element 204. In the case of using N-type transistors as the driving transistor 202 and the current control transistor 203, the source of the driving transistor 202 is connected to the cathode of the light-emitting element 204. In this case, the cathode of the light-emitting element 204 serves as the pixel electrode, and the anode thereof serves as the counter electrode.

Operation of the pixel shown in FIG. 2 can be divided into a write period, a data retention period, and an erasing period. Operations of the switching transistor 201, the driving transistor 202, and the current control transistor 203 in the write period and data retention period are the same as those of FIG. 1.

Figure 21:
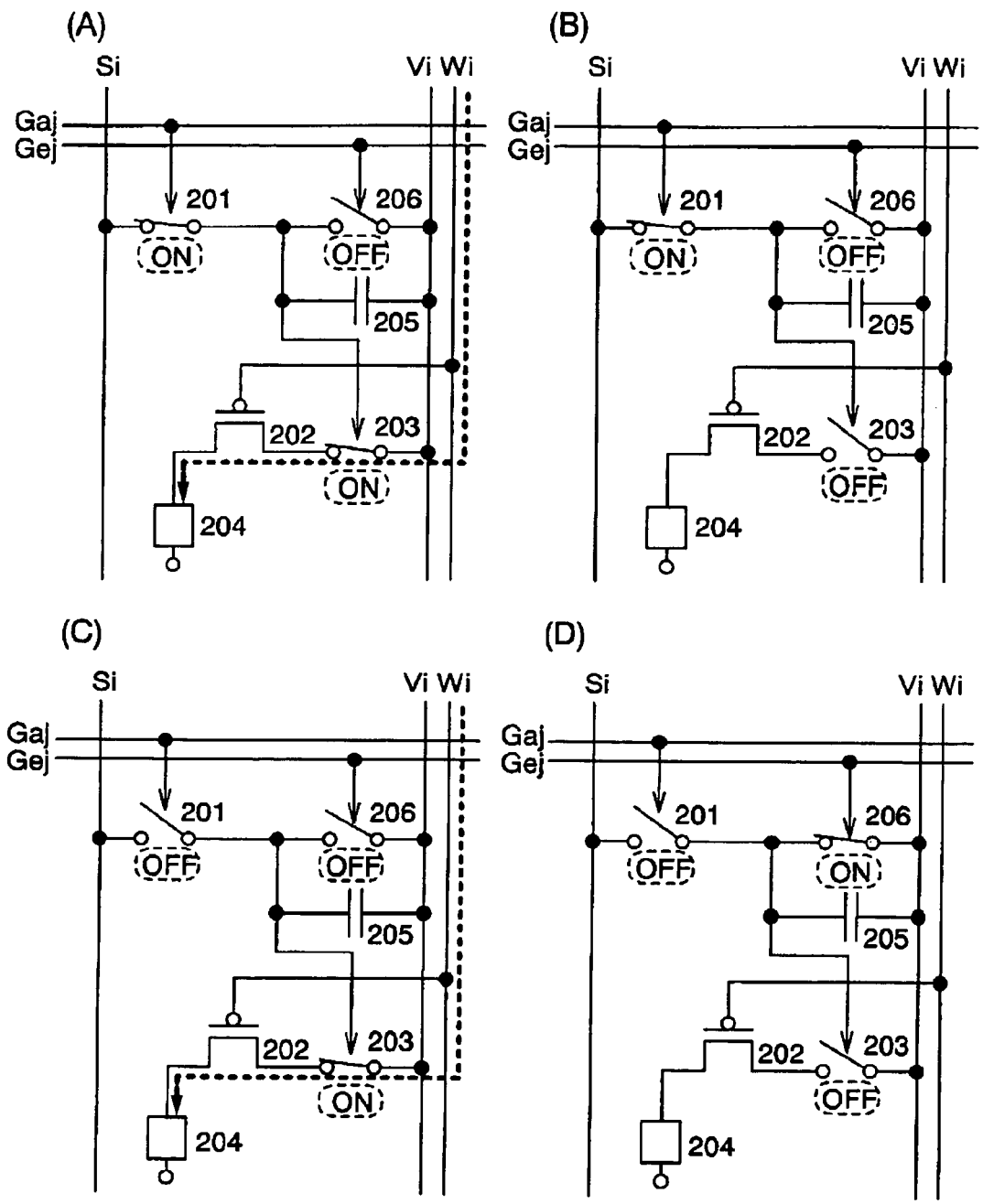
FIG. 21 is an illustration of pixel driving methods of this invention.

Shown in FIG. 21(A) is an operation when the current control transistor 203 is turned on by a video signal during the write period, and shown in FIG. 21(B) is an operation when the current control transistor 203 is in an off-state during the write period. Shown in FIG. 21(C) is an operation when the current control transistor 203 is in an on-state during the data retention period, and shown in FIG. 21(D) is an operation during the erasing period. In addition, in order to facilitate understanding of the operations, the switching transistor 210, the current control transistor 203, and the erasing transistor 206 used as switching elements are illustrated in FIGS. 21(A) to 21(D) as switches.

When the first scan line Gaj (=1 to y) is selected during the write period, the switching transistor 201 whose gate is connected to the first scan line Gaj (j=1 to y) is turned on. Then, a video signal input to a signal line Si (i=1 to x) is input to the gate of the current control transistor 203 via the switching transistor 201. Since the gate of the driving transistor 202 is connected to the first power line Vi (i=1 to x), the driving transistor 202 is always in the on-state.

In the case where the current control transistor 203 is turned on by the video signal, a current is supplied to the light-emitting element 204 via the first power line Vi (i=1 to x) as shown in FIG. 21(A). Here, since the current control transistor 203 operates in the linear area, the current flowing to the light-emitting element 204 is decided depending on the driving transistor 202 operating in the saturation area and a voltage/current characteristic of the light-emitting element 204. The light-emitting element 204 emits light having luminosity corresponding to the supplied current.

In the case where the current control transistor 203 is turned off by the video signal as shown in FIG. 21(B), no current is supplied to the light-emitting element 204 so that the light-emitting element 204 does not emit light.

In the data retention period, a potential of the first scan line Gj (j=1 to y) is so controlled as to turn off the switching transistor 201, so that a potential of the video signal written during the write period is maintained. Since the potential of the video signal is maintained by the capacitance element 205 in the case where the current control transistor 203 is turned on during the write period, the current supply to the light-emitting element 204 is maintained as shown in FIG. 21(C). In contrast, because the potential of the video signal is maintained by the capacitance element 205 when the current control transistor 203 is turned off during the write period, the current supply to the light-emitting element 204 is not performed.

During the erasing period, the second scan line Gej (j=1 to y) is selected to turn on the erasing transistor 206 as shown in FIG. 21(D), so that the potential of the power line Vi (i=1 to x) is applied to the gate of the current control transistor 203 via the erasing transistor 206. Therefore, the current control transistor 203 is turned off to forcibly create a state in which no current is supplied to the light-emitting element 204.

EXAMPLES

Hereinafter, examples of this invention will be described.

Example 1

A constitution and a driving in the case where the pixel structure of this invention is used for an active matrix type display device will be described.

Figure 3:
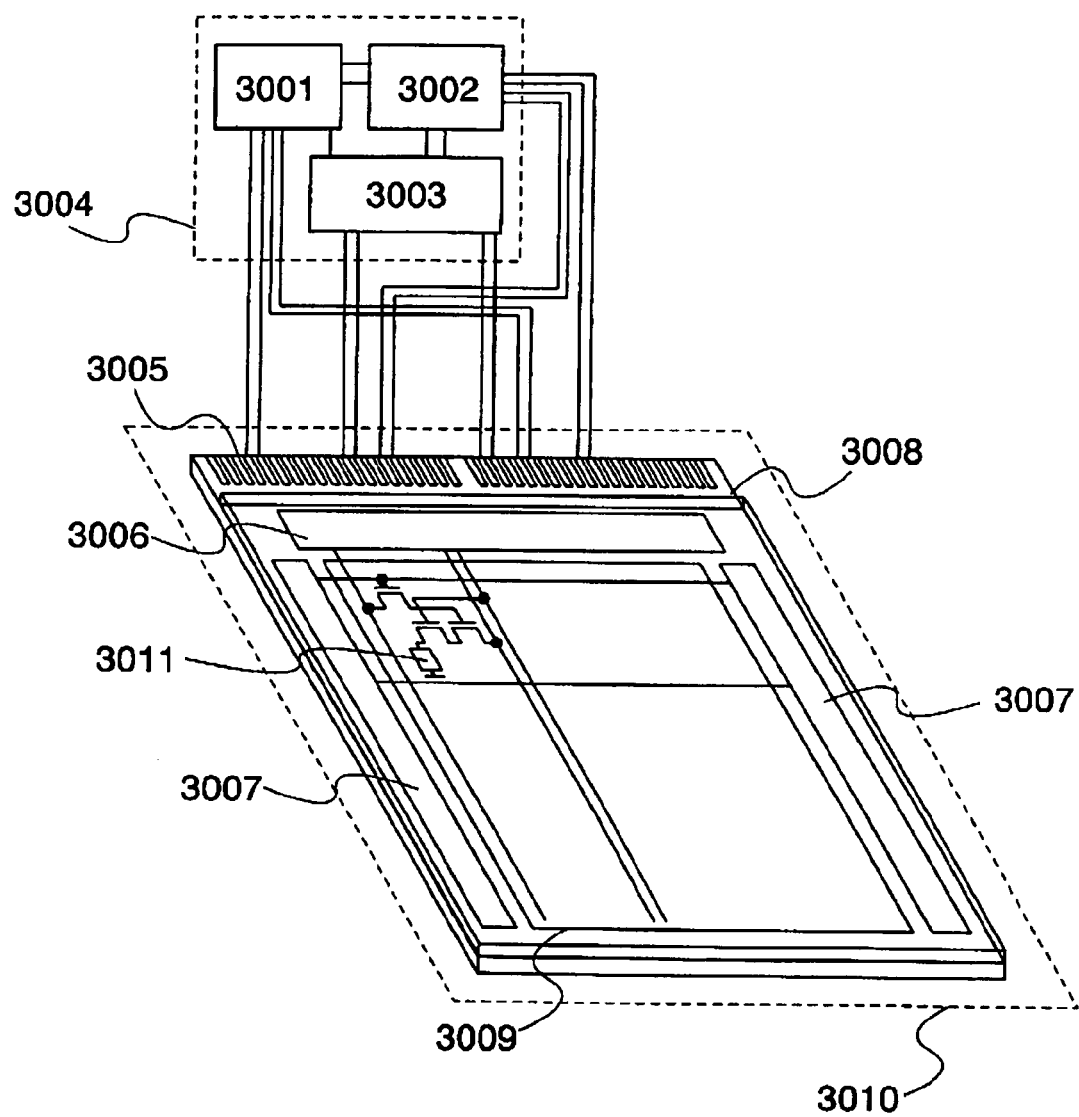
FIG. 3 is a diagram showing a general outline of an external circuit and a panel.

Shown in FIG. 3 are a block diagram of an external circuit and a schematic view of a panel.

As shown in FIG. 3, the active matrix type display device has an external circuit 3004 and a panel 3010. The external circuit 3004 has an A/D converter 3001, a power unit 3002, and a signal generation unit 3003. The A/D converter 3001 converts an image signal which is input as an analog signal into a digital signal (video signal) to supply the digital signal to a signal line driving circuit 3006. The power unit 3002 generates powers each having a desired voltage from a power supplied from a battery or an electric outlet to supply the powers separately to the signal driving circuit 3006, a scan line driving circuit 3007, a light-emitting element 3001, the signal generation unit 3003, and so forth. The power, the image signal, and a synchronizing signal are input to the signal generation unit 3003, and the signal generation unit 3003 performs conversions of various signals to generate clock signals for driving the signal line driving circuit 3006 and the scan line driving circuit 3007 and like signals.

A signal and a power sent from the external circuit 3004 are input from an FPC connecting unit 3005 disposed inside the panel 3010 to an internal circuit and the like through an FPC.

The panel 3010 has a substrate 3008 on which the FPC connection unit 3005, the internal circuit, and the light-emitting element 3011 are mounted. The internal circuit has the signal line driving circuit 3006, the scan line driving circuit 3007, and a pixel unit 3009. Though the pixel which is described in Embodiment 1 is shown in FIG. 3 by way of example, it is possible to use any one of the pixels described in the embodiments of this invention as the pixel unit 3009.

The pixel unit 3009 is disposed on the center of the substrate, and the signal line driving circuit 3006 and the scan line driving circuit 3007 are disposed around the pixel unit 3009.

The light-emitting element 3011 and a counter electrode of the light-emitting element is formed on a whole surface of the pixel unit 3009.

Figure 4:
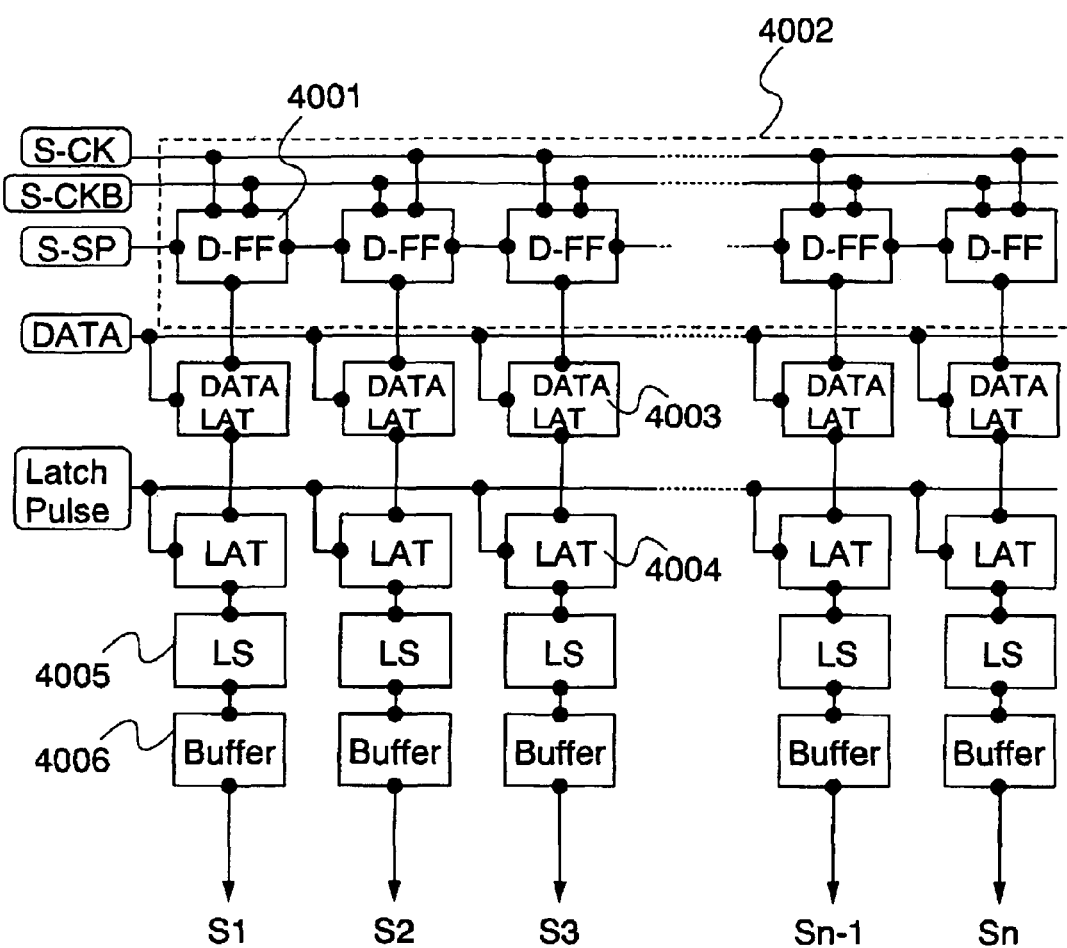
FIG. 4 is a diagram showing one example of a signal line driving circuit.

Shown in FIG. 4 is a block diagram showing the signal line driving circuit 3006 in detail.

The signal line driving circuit 3006 has a shift resistor 4002 consisting of a plurality of D-flip flops 4001, data latch circuits 4003, latch circuits 4004, level shifters 4005, buffers 4006, and the like.

Signals used in this example as those input to the signal line driving circuit 3006 are a clock signal line (S-CK), a reverse clock signal line (S-CKB), a start pulse (S-SP), a video signal (DATA), and a latch pulse.

Sampling pulses are output from the shift register 4002 sequentially in accordance with timings of the clock signal, the clock reverse signal, and the start pulse. The sampling pulses are input to the data latch circuit 4003, so that the video signal is fetched and retained at the timing of the input. This operation is performed for each of columns sequentially from left to right.

After a completion of the video signal retention in the data latch circuit 4003 of the last column, the latch pulse is input during a horizontal retrace period, so that the video signals retained in the data latch circuits 4003 are transferred simultaneously to the latch circuits 4004. After that, the signals are level-shifted in the level shifters 4005 and reshaped in the buffers 4006 to be output simultaneously to the signal lines S1 to Sn. Here, an H level and an L level are input to the pixels in columns selected by the scan line driving circuit 3007 to control emission and non-emission of the light-emitting elements 3011.

Though the active matrix type display device described in this invention has the panel 3010 and the external circuit 3004 which are independent from each other, they may be integrally formed on an identical substrate. Also, though the display device using the OLEDs is described by way of example in this example, light-emitting elements other than the OLEDs may be used for the light-emitting device. Also, the level shifters 4005 and the buffers 4006 are not necessarily disposed inside the signal line driving circuit 3006.

Example 2

Figure 5:
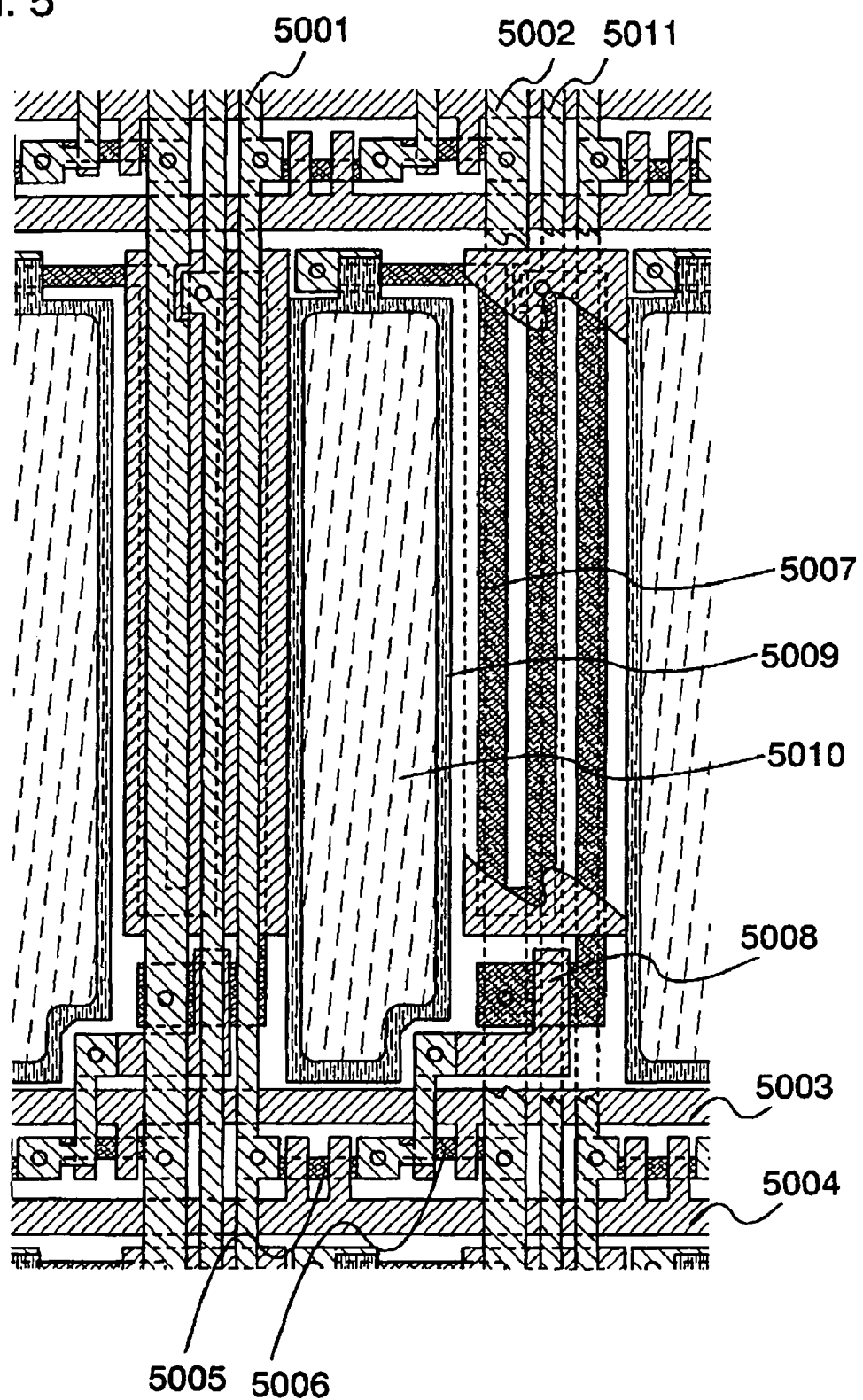
FIG. 5 is a diagram showing one example of a top view of this invention.

In this example, one example of a top view of the pixels shown in FIG. 2 will be described. Shown in FIG. 5 is the pixel top view of this example.

Denoted by 5001 is a signal line, denoted by 5002 is a first power line, denoted by 5001 is a second power line, denoted by 5004 is a first scan line, and denoted by 5003 is a second scan line. In this example, the signal line 5001, the first power line 5002, and the second power line 5011 are formed from an identical electro-conductive film, and the first scan line 5004 and the second scan line 5003 are formed from an identical electro-conductive film. Denoted by 5005 is a switching transistor, and a part of the first scan line 5004 functions as a gate electrode of the switching transistor 5005. Denoted by 5006 is an erasing transistor, and a part of the second scan line 5003 functions as a gate electrode of the erasing transistor 5006. Denoted by 5007 is a driving transistor, and denoted by 5008 is a current control transistor. The driving transistor 5007 has a wound active layer used for maintaining an L/W thereof at a value larger than that of the current control transistor 5008. For instance, the size of the driving transistor 5007 may be set to L=200 nm and W=4 nm, while the size of the current control transistor 5008 may be set to L=6 nm and W=12 nm. Denoted by 5009 is a pixel electrode, and light is emitted in an area (light-emitting area) 5010 which overlaps with an electro-luminescent layer and a cathode (both not shown).

The top view of this invention is not more than one example, and it is needless to say that this invention is not limited thereto.

Example 3

Figure 8:
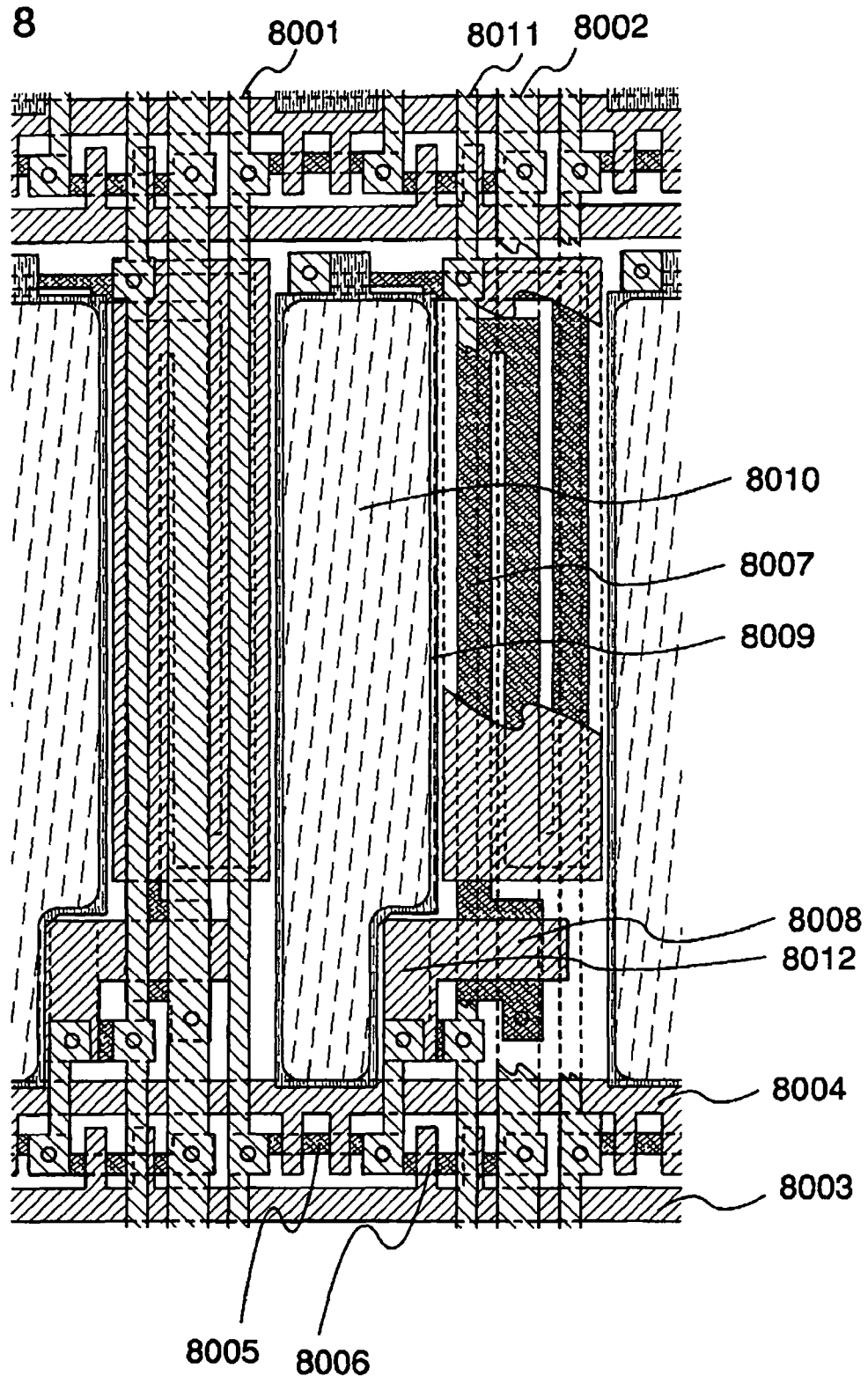
FIG. 8 is a diagram showing another example of the top view of this invention.

In this example, another example of the top view of the pixels shown in FIG. 2 will be described. Shown in FIG. 8 is the pixel top view of this example.

Denoted by 8001 is a signal line, denoted by 8002 is a first power line, denoted by 8011 is a second power line, denoted by 8004 is a first scan line, and denoted by 8003 is a second scan line. In this example, the signal line 8001, the first power line 8002, and the second power line 8011 are formed from an identical electro-conductive film, and the first scan line 8004 and the second scan line 8003 are formed from an identical electro-conductive film. Denoted by 8005 is a switching transistor, and a part of the first scan line 8004 functions as a gate electrode of the switching transistor 8005. Denoted by 8006 is an erasing transistor, and a part of the second scan line 8003 functions as a gate electrode of the erasing transistor 8006. Denoted by 8007 is a driving transistor, and denoted by 8008 is a current control transistor. The driving transistor 8007 has a wound active layer used for maintaining an L/W thereof at a value larger than that of the current control transistor 8008. For instance, the size of the driving transistor 8007 may be set to L=200 nm and W=4 nm, while the size of the current control transistor 8008 may be set to L=6 nm and W=12 nm. Denoted by 8009 is a pixel electrode, and light is emitted in an area (light-emitting area) 8010 which overlaps with an electro-luminescent layer and a cathode (both not shown). Denoted by 8012 is a capacitance unit formed from an insulating film disposed between the second power line 8011 and the current control transistor 8008.

The top view of this invention is not more than one example, and it is needless to say that this invention is not limited thereto.

Example 4

A sectional structure of a pixel will be described in this example.

Figure 9:
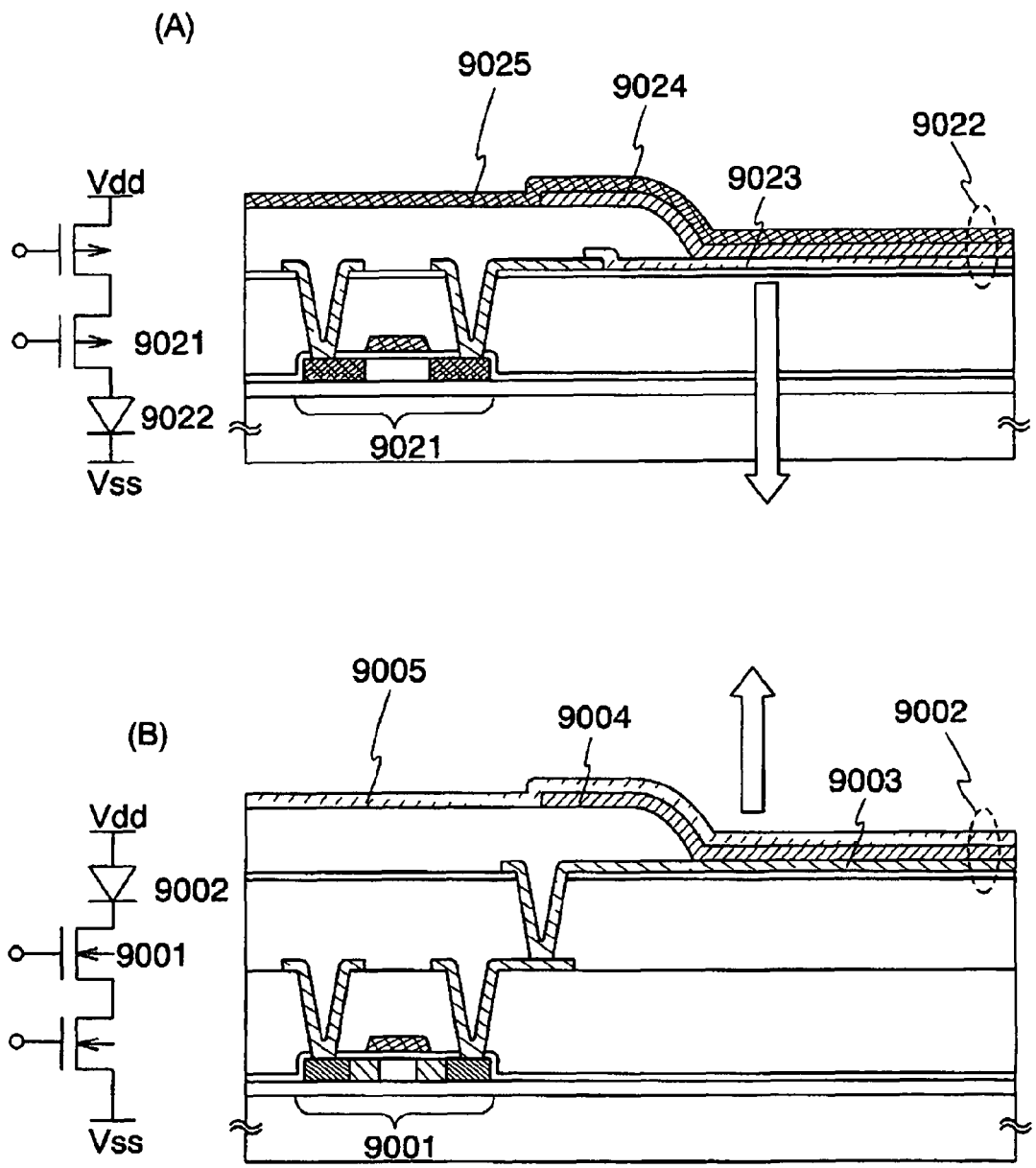
FIG. 9 is a diagram showing one example of a sectional structure of this invention.

Shown in FIG. 9(A) is a sectional view of a pixel in the case where a driving transistor 9021 is of the P-type, and light emitted from a light-emitting element 9022 is ejected in a direction of an anode 9023. Referring to FIG. 9(A), the anode 9023 of the light-emitting element 9022 is electrically connected to the driving transistor 9021, and an electro-luminescent layer 9024 and a cathode 9025 are formed in this order on the anode 9023. Any known material may be used for the cathode 9025 so far as it is an electro-conductive film having a small work function and reflecting light. Preferred examples of the material are Ca, Al, CaF, MgAg, AlLi, and the like. The electro-luminescent layer 9024 may be formed of either one of one layer or a stack of a plurality of layers. In the case where the electro-luminescent layer 9024 is formed of the plurality of layers, a hole injection layer, a hole transport layer, a light-emitting layer, an electron transport layer, and an electron injection layer may be formed in this order on the anode 9023. It is unnecessary to provide all of these layers. A transparent electro-conductive film capable of transmitting light is used for forming the anode 9023, and examples of the transparent electro-conductive film may be ITO, an electro-conductive film formed by mixing indium oxide with 2 to 20% of zinc oxide (ZnO).

A portion at which the anode 9023, the electro-luminescent layer 9024, and the cathode 9025 are overlapped with one another corresponds to the light-emitting element 9022. In the case of the pixel shown in FIG. 9(A), the light emitted from the light-emitting element 9022 is ejected in a direction of the anode 9023 as indicated by an white arrow.

Shown in FIG. 9(B) is a sectional view of a pixel in the case where a driving transistor 9001 is of the N-type and light emitted from the light-emitting element 9002 is ejected in a direction of an anode 9005. Referring to FIG. 9(B), a cathode 9003 of the light-emitting element 9002 is electrically connected to the driving transistor 9001, and an electro-luminescent layer 9004 and the anode 9005 are formed in this order on the cathode 9003. Any known material may be used for the cathode 9003 so far as it is an electro-conductive film having a small work function and reflecting light. Preferred examples of the material are Ca, Al, CaF, MgAg, AlLi, and the like. The electro-luminescent layer 9004 may be formed of either one of one layer or a stack of a plurality of layers. In the case where the electro-luminescent layer 9004 is formed of the plurality of layers, an electron injection layer, an electron transport layer, a light-emitting layer, a hole transport layer, and a hole injection layer may be formed in this order on the cathode 9003. It is unnecessary to provide all of these layers. A transparent electro-conductive film capable of transmitting light is used for forming the anode 9005, and examples of the transparent electro-conductive film may be ITO, an electro-conductive film formed by mixing indium oxide with 2 to 20% of zinc oxide (ZnO).

A portion at which the cathode 9003, the electro-luminescent layer 9004, and the anode 9005 are overlapped with one another corresponds to the light-emitting element 9002. In the case of the pixel shown in FIG. 9(B), the light emitted from the light-emitting element 9002 is ejected in a direction of the anode 9005 as indicated by an white arrow.

Though the driving transistor is electrically connected to the light-emitting element in this example, a current control transistor may be connected between the driving transistor and the light-emitting element.

Example 5

Figure 10:
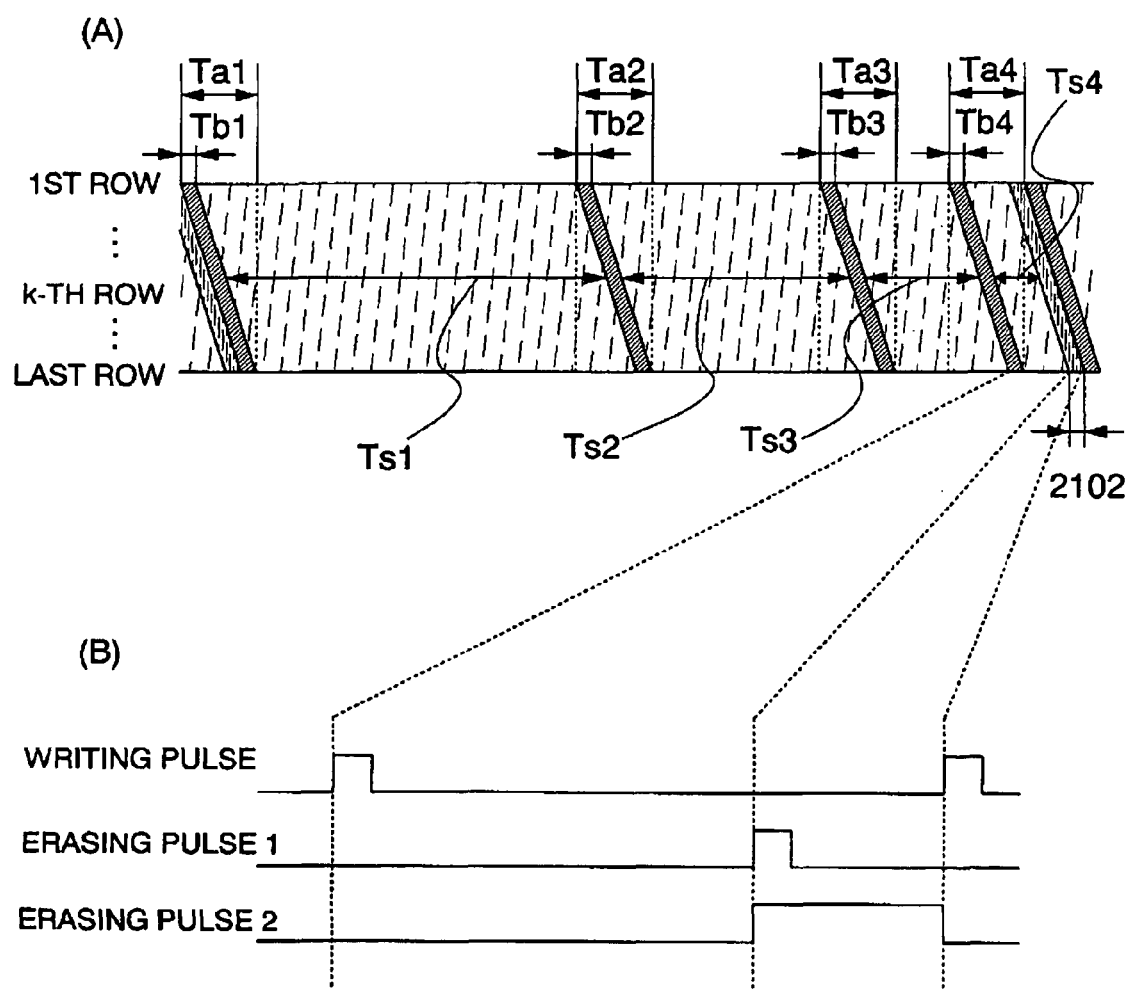
FIG. 10 is a diagram showing one example of an operation timing of this invention.

One example of a driving timing using the pixel structure of this invention will be described using FIG. 10.

Shown in FIG. 10(A) is one example of a case of displaying a 4-bit gradation using a digital time gradation method. A length ratio among data retention periods Ts1 to Ts4 is set to Ts1: Ts2: Ts3: Ts4=$2^3$: $2^2$: $2^1$:$2^0$=8:4: 2:1.

Operation will hereinafter be described. A first scan line is selected in each of the rows sequentially in descending order during a write period Tb1 to turn on switching transistors. Then, video signals are input from signal lines to pixels, so that emission and non-emission of the pixels are controlled by potentials of the video signals. In the row where the video signal writing has completed, transition to the data retention period Ts1 is performed immediately. The same operation is performed in the rows, and a period Ta1 terminates when the operation is performed in the last row. Here, transition to a write period Tb2 is performed in the rows sequentially in the order of termination of the data retention period Ts1.

Here, in a sub-frame period (corresponding to Ts4 in this example) having a data retention period shorter than the write period, an erasing period 2102 is provided so that the next period does not start immediately after the termination of the data retention period. The light-emitting elements are forcibly kept in the non-emission state during the erasing period.

Though the case of displaying the 4-bit gradation has been described in this example, the number of bits and the number of gradations are not limited thereto. The order of the light emission is not necessarily the order of from Ts1 to Ts4, and a random order may be used, or may be divided into a plurality of sections.

Shown in FIG. 10(B) are examples of a write pulse and an erasing pulse. The erasing pulse is input to each of rows as illustrated as an erasing pulse 1 and may be retained by a capacitance unit during the erasing period or an H level may be input all through the erasing period as illustrated as an erasing pulse 2. The pulses shown in FIG. 10(B) are used in the case where both of the switching transistor and the erasing transistor are of the N-type, and, in the case where both of the switching transistor and the erasing transistor are of the P-type, the H level and the L level of the pulses shown in FIG. 10(B) are reversed.

Example 6

The display device using the light-emitting device of the invention can be used in display portions of various electronic apparatuses. In particular, the display device of the invention is desirably applied to a mobile device that preferably consumes less power.

Electronic apparatuses using the display device of the invention include a portable information terminal (a cellular phone, a mobile computer, a portable game machine, an electronic book, and the like), a video camera, a digital camera, a goggle display, a display device, a navigation system, and the like. Specific examples of these electronic apparatuses are shown in FIGS. 6A to 6D.

Figure 6:
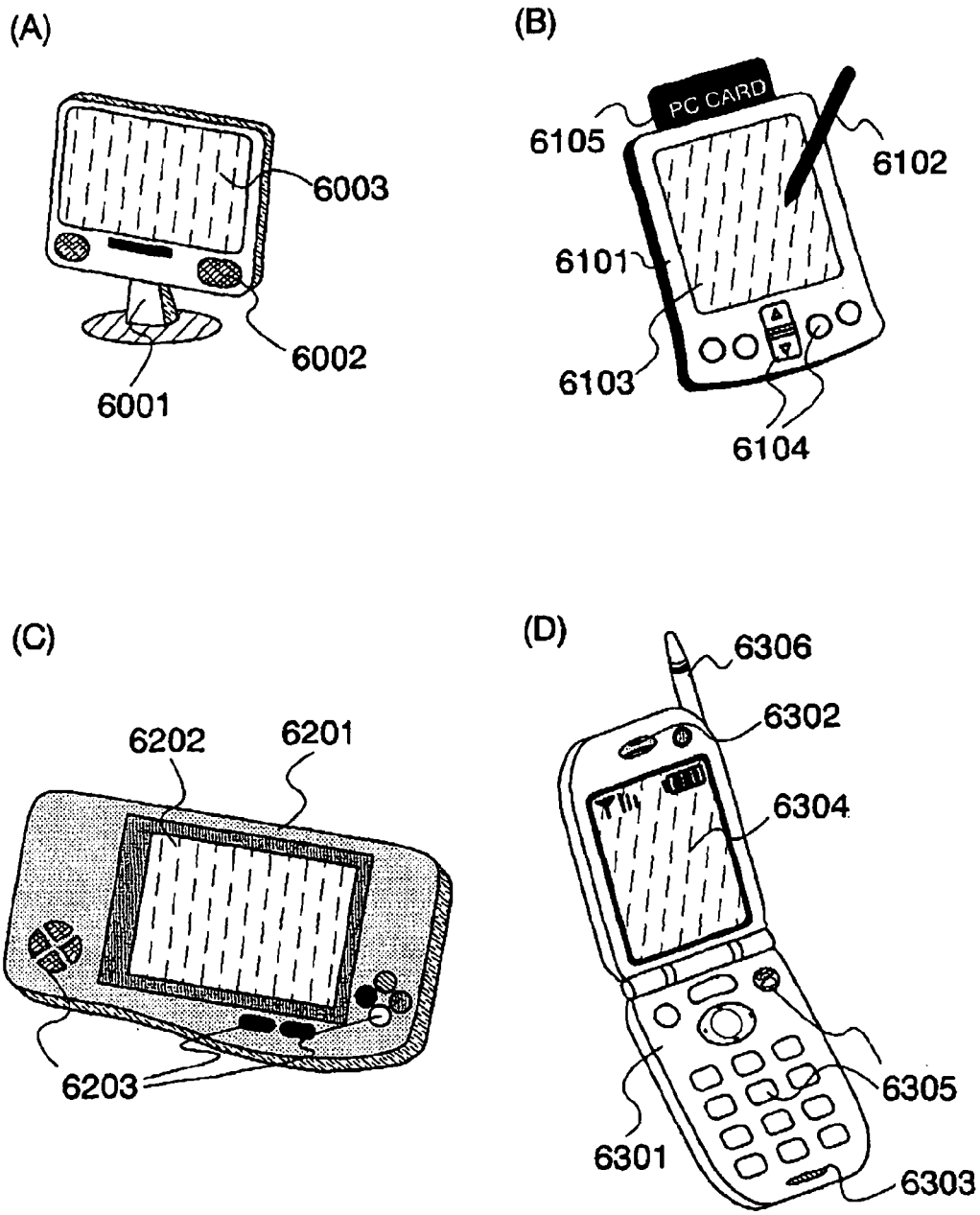
FIG. 6 is a diagram showing one example of an electronic appliance to which this invention is applicable.
Figure 7:
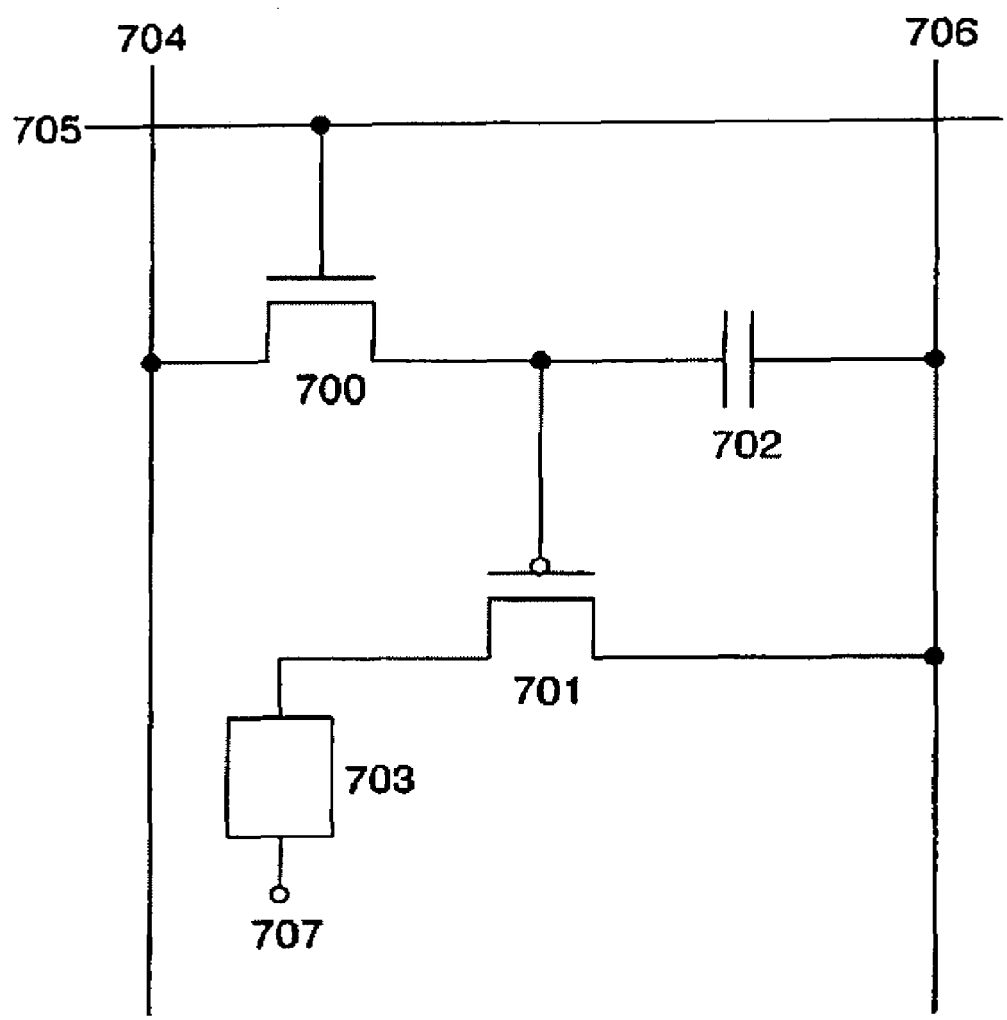
FIG. 7 is a diagram showing a conventional example.

FIG. 6A illustrates a display device which includes a housing 6001, an audio output portion 6002, a display portion 6003, and the like. The light-emitting device of the invention can be applied to the display portion 6003. Note that the display device includes all the information display devices for personal computers, television broadcast reception, advertisement, and the like.

FIG. 6B illustrates a mobile computer which includes a main body 6101, a stylus 6102, a display portion 6103, operation keys 6104, an external interface 6105, and the like. The light-emitting device of the invention can be applied to the display portion 6103.

FIG. 6C illustrates a game machine which includes a main body 6201, a display portion 6202, operation keys 6203, and the like. The light-emitting device of the invention can be applied to the display portion 6202.

FIG. 6D illustrates a cellular phone which includes a main body 6301, an audio output portion 6302, a display portion 6304, operation switches 6305, an antenna 6306, and the like. The light-emitting device of the invention can be applied to the display portion 6304.

As described above, an application range of the light-emitting device of the invention is so wide that the invention can be applied to electronic apparatuses in various fields.

Example 7

Figure 11:
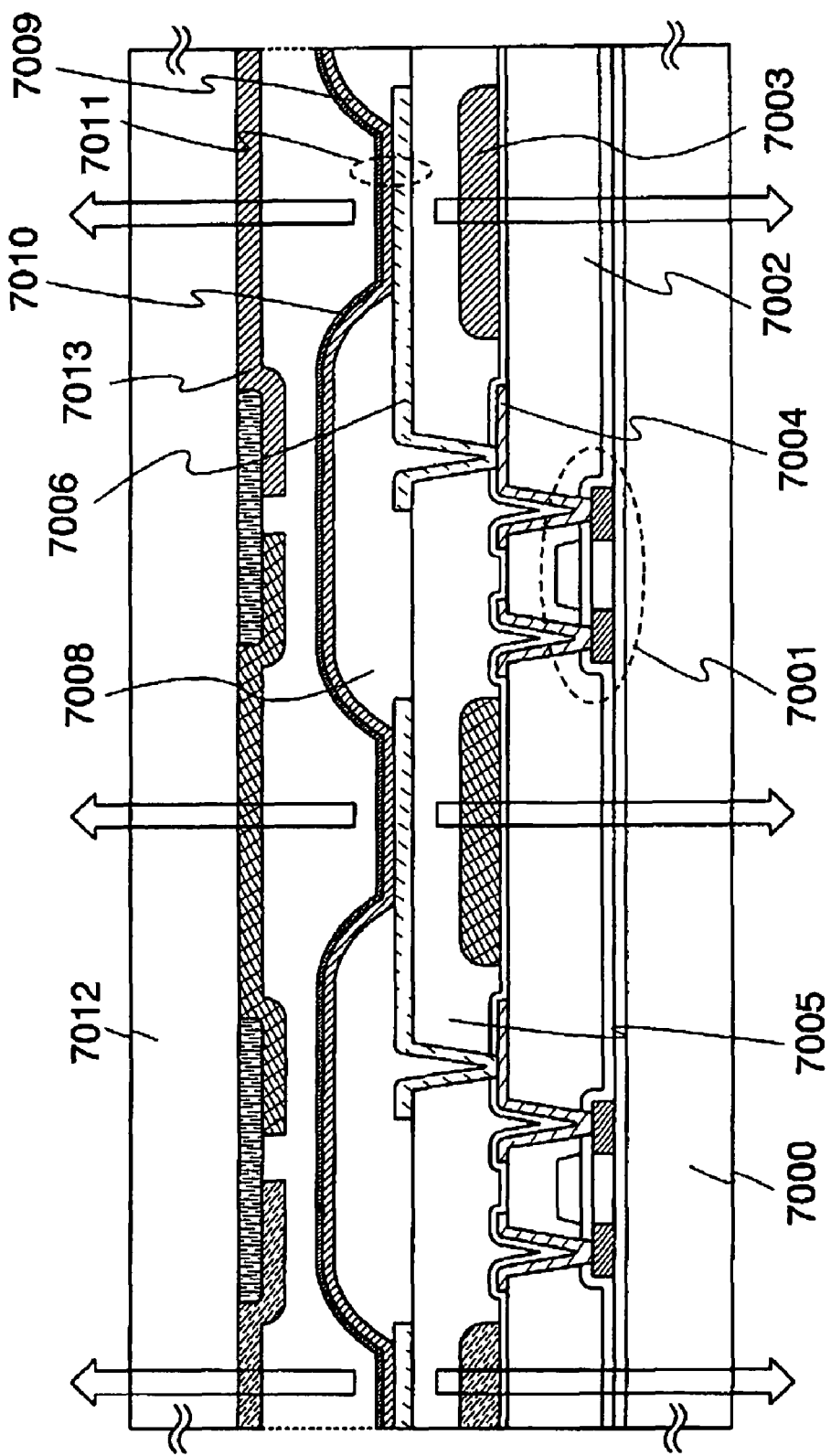
FIG. 11 is a diagram showing another example of the sectional structure of this invention.

Using FIG. 11, a sectional structure of a pixel of the light-emitting device of this invention will be described. Shown in FIG. 11 is a driving transistor 7001 which is formed on a substrate 7000. The driving transistor 7001 is covered with a first interlayer insulating film 7002, and a color filter 7003 formed from a resin or the like and a wiring 7004 electrically connected to a drain of the driving transistor 7001 via a contact hole are formed on the first interlayer insulating film

7002. A current control transistor may be provided between the driving transistor 7001 and the wiring 7004.

A second interlayer insulating film 7005 is formed on the first interlayer insulating film 7002 in such a manner as to cover the color filter 7003 and the wiring 7004. A silicon oxide film, a silicon nitride film, or a silicon oxide nitride film formed by plasma CVD or sputtering or a stack of these films formed by plasma CVD or sputtering may be used as the first interlayer insulating film 7002 or the second interlayer insulating film 7005. Also, a film obtained by stacking a silicon oxide nitride film wherein a molar ratio of oxygen is higher than that of nitrogen on a silicon oxide nitride film wherein a molar ratio of nitrogen is higher than that of oxygen may be used as the first interlayer insulating film 7002 or the second interlayer insulating film 7005. Alternatively, an organic resin film may be used as the first interlayer insulating film 7002 or the second interlayer insulating film 7005.

A wiring 7006 electrically connected to the wiring 7004 via a contact hole is formed on the second interlayer insulating film 7005. A part of the wiring 7006 functions as an anode of a light-emitting element. The wiring 7006 is formed in such a manner as to overlap with the color filter 7003 with the second interlayer insulating film 7005 being sandwiched therebetween.

An organic resin film 7008 to be used as a partition is formed on the second interlayer insulating film 7005. The organic resin film has an opening, and the wiring 7006 functioning as the anode, an electro-luminescent layer 7009, and a cathode 7010 are formed in such a manner as to overlap with one another on the opening to form the light-emitting element 7011. The electro-luminescent layer 7009 is formed of a single light-emitting layer or has a structure that a plurality of layers including the light-emitting layer are stacked. A protection film may be formed on the organic resin film 7008 and the cathode 7010. In this case, a film less subject to permeation of substances promoting deterioration of the light-emitting element, such as moisture, oxygen, etc., as compared with other insulating films is used as the protection film. Typically, it is desirable to use a DLC film, a carbon nitride film, a silicon nitride film formed by RF sputtering, or the like as the protection film. It is possible to use a film obtained by stacking the film less subject to the permeation of substances such as moisture and oxygen and a film subject to the permeation of substances such as moisture and oxygen as compared with the formerly mentioned film as the protection film.

The organic resin film 7008 is heated under a vacuum atmosphere so as to eliminate absorbed moisture, oxygen, and so forth before forming the electro-luminescent layer 7009. More specifically, a heat treatment at 100° C. to 200° C. is performed under a vacuum atmosphere for about 0.5 to 1 hour. It is desirable to perform the heat treatment under $3 \times 10^{-7}$ Torr or less, most desirably under $3 \times 10^{-8}$ Torr, if possible. In the case of forming the electro-luminescent layer after subjecting the organic resin film to the heat treatment under the vacuum atmosphere, it is possible to improve reliability by maintaining the vacuum atmosphere until shortly before the film formation.

It is desirable to round an edge of the opening of the organic resin film 7008 so that the electro-luminescent layer 7009 formed on the organic resin film 7008 in the partially overlapping manner is not pierced at the edge. More specifically, it is desirable that a radius of curvature of a curve of a section of the opening of the organic resin film is from 0.2 to 2 μm.

With the above-described constitution, it is possible to achieve a satisfactory coverage of the electro-luminescent layer and the cathode to be formed afterward and to prevent the wiring 7006 and the cathode 7010 from being short-circuited in the hole formed in the electro-luminescent layer 7009. Also, by mitigating stress of the electro-luminescent layer 7009, it is possible to reduce a defect called shrinkage, which is a reduction in light emission area, thereby enhancing the reliability.

In addition, in the example shown in FIG. 11, a positive photosensitive acryl resin is used as the organic resin film 7008. Photosensitive organic resins are broadly divided into a positive type in which a portion exposed to energy rays such as light, electrons, ions is removed and a negative type in which the exposed portion remains. The negative type organic resin film may be used in this invention. Also, the organic resin film 7008 may be formed by using photosensitive polyimide. In the case of forming the organic resin film 7008 using a negative type acryl, the edge of the opening has a section in the form of the letter "S". Here, it is desirable to set a radius of curvature of each of an upper end and a lower end of the opening to 0.2 to 2 μm.

A transparent electro-conductive film may be used for the wiring 7006. Usable examples of the transparent electro-conductive film is an ITO and a transparent electro-conductive film obtained by mixing 2 to 20% of indium oxide with zinc oxide (ZnO). In FIG. 11, the ITO is used as the wiring 7006. The wiring 7006 may be polished by wiping using a CMP method and a polyvinyl alcohol-based porous material so as to smooth out its surface. Also, the surface of the wiring 7006 may be irradiated with ultraviolet rays or treated with oxygen plasma after undergoing the polishing using the CMP method.

Any known material may be used for the cathode 7010 so far as it is an electro-conductive film having a thickness capable of transmitting light and a small work function. Preferred examples of the material are Ca, Al, CaF, MgAg, AlLi, and the like. In order to obtain light from the cathode side, a method of using ITO which is reduced in work function by an addition of Li may be employed in addition to a method of thinning the film thickness. A structure of the light-emitting element used in this invention is not particularly limited so far as it enables light emission from both of the anode side and the cathode side.

In practice, it is preferable to perform packaging (enclosure) with a protection film (laminate film, ultraviolet curing resin film, etc.) or a transparent glazing material 7012 which is high in air tightness and less subject to degasification. In the packaging, the reliability of the light-emitting element is improved by maintaining an inside of the glazing material under an inert atmosphere or disposing an moisture absorbent (e.g., barium oxide) inside the glazing material. In this invention, the glazing material 7012 may be provided with a color filter 7013.

Note that this invention is not limited to the above-described manufacturing process and that it is possible to use any known method for the manufacture.

Example 8

In this example, a pixel structure in the case where positions of the driving transistor 202 and the current control transistor 203 are exchanged in the pixel shown in FIG. 2 will be described.

Figure 12:
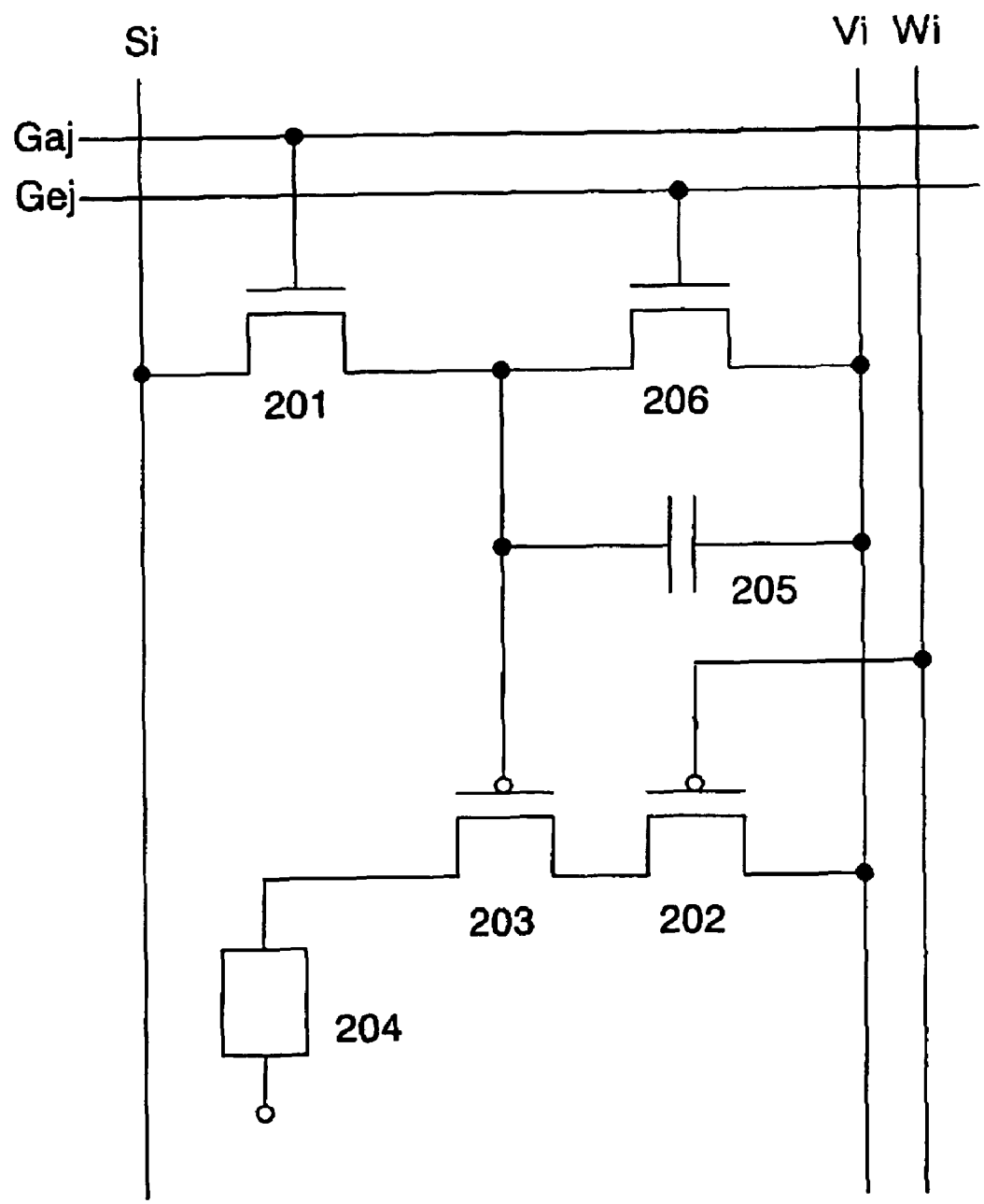
FIG. 12 is a diagram showing another embodiment of this invention.

Shown in FIG. 12 is a circuit structure of the pixel of this example. The elements and wirings shown in FIG. 2 are denoted by the same reference numerals in FIG. 12. The pixel shown in FIG. 12 and the pixel shown in FIG. 2 has a common point that the current supplied from the first power line Vi (i=1 to x) is supplied to the light-emitting element 204 as the drain current of the driving transistor 202 and the current control transistor 203. But the pixel shown in FIG. 12 is different from the pixel shown in FIG. 2 in that the source of the driving transistor 202 is connected to the first power line Vi (i=1 to x), while the drain of the current control transistor is connected to the pixel electrode of the light-emitting element 204.

A gate/source voltage Vgs of the driving transistor 202 is fixed by connecting the source of the driving transistor 202 to the first power line Vi as described in this example. That is, the gate/source voltage Vgs of the driving transistor 202 operating in the saturation area does not change and remains to be fixed even if the light-emitting element 204 is degraded. Therefore, in this example, it is possible to prevent a fluctuation in drain current of the driving transistor 202 operating in the saturation area even if the light-emitting element 204 is degraded.

Example 9

Figure 13:
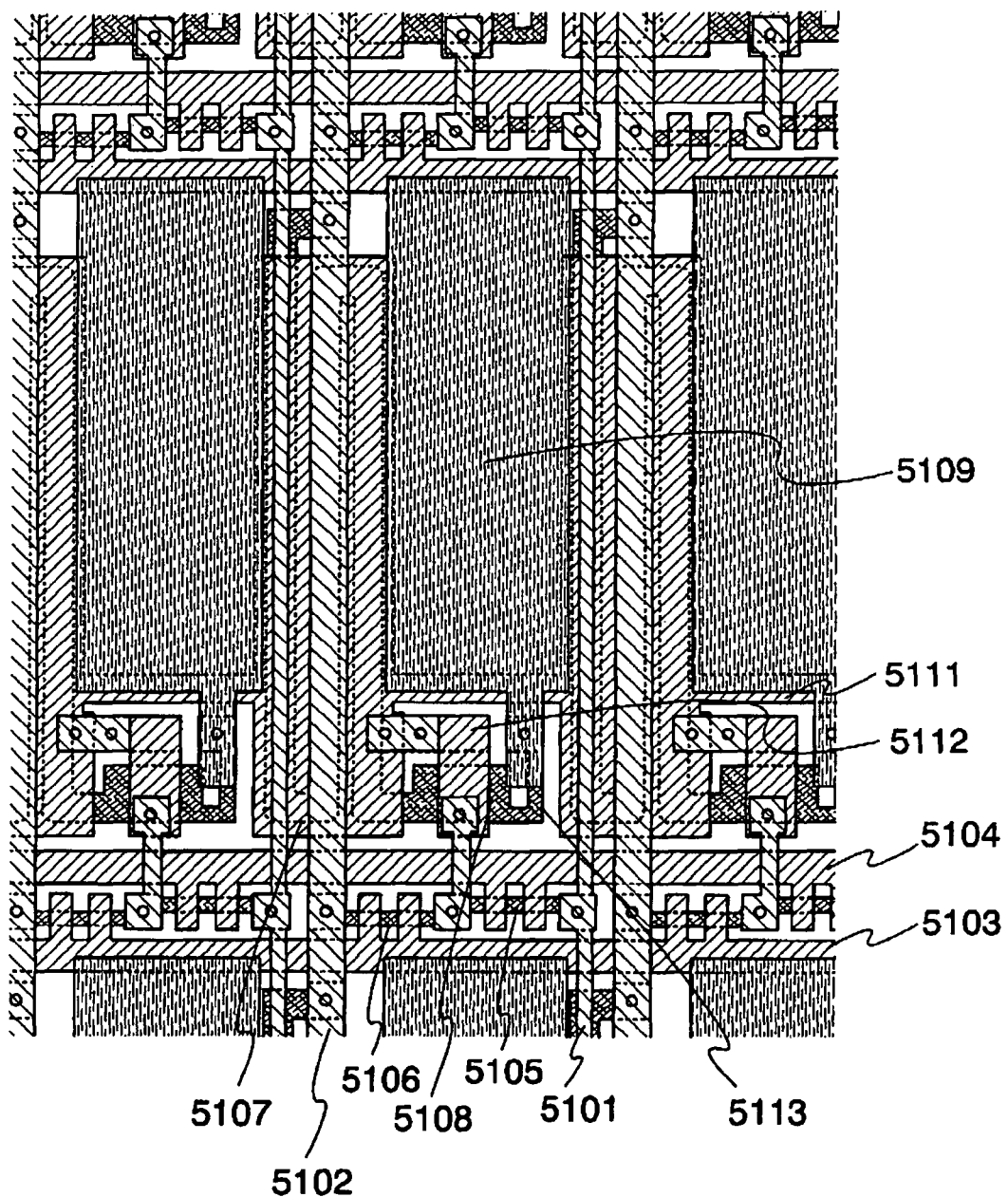
FIG. 13 is a diagram showing another example of the top view of this invention.

In this example, one example of a top view of the pixel shown in FIG. 12 will be described. Note that a resistance is provided between the pixel electrode of the light-emitting element 204 and the drain of the current control transistor 203 in the pixel shown in FIG. 12 will be described in this example. Shown in FIG. 13 is the top view of the pixel of this example.

Denoted by 5101 is a signal line, denoted by 5102 is a first power line, denoted by 5111 is a second power line, denoted by 5104 is a first scan line, and denoted by 5103 is a second scan line. In this example, the signal line 5101, the first power line 5102, and the second power line 5111 are formed from an identical electro-conductive film, and the first scan line 5104 and the second scan line 5103 are formed from an identical electro-conductive film. Denoted by 5105 is a switching transistor, and a part of the first scan line 5104 functions as a gate electrode of the switching transistor 5105. Denoted by 5106 is an erasing transistor, and a part of the second scan line 5103 functions as a gate electrode of the erasing transistor 5106. Denoted by 5107 is a driving transistor, and denoted by 5108 is a current control transistor. Denoted by 5112 is a capacitance element, and denoted by 5113 is a resistance formed from a semiconductor film. The driving transistor 5107 has a wound active layer used for maintaining an L/W thereof at a value larger than that of the current control transistor 5108. For instance, the size of the driving transistor 5107 may be set to L=200 nm and W=4 nm, while the size of the current control transistor 5108 may be set to L=6 nm and W=12 nm. Denoted by 5109 is a pixel electrode, and light is emitted in an area (light-emitting area) where the pixel electrode 5109 overlaps with an electro-luminescent layer (not shown) and a cathode (not shown).

In the case of forming the pixel electrode 5109 by forming an electro-conductive film and then patterning the electro-conductive film, it is possible to prevent the driving transistor 5107 from being destroyed due to a sharp change in potential of the drain of the driving transistor 5107 caused by an electric charge charged on the electro-conductive film by using the resistance 5113. Also, it is possible to use the resistance 5113 as an electrostatic countermeasure until a deposition of an EL.

In addition, it is needless to say that the top view of this invention is described only by way of example and that the invention is not limited thereto.

Example 10

In this example, a pixel structure when pixels using the first scan line Gaj (j=1 to y) or the second scan line Gej (j=1 to y) further use the second power line Wj (i=1 to x) will be described using the pixel shown in FIG. 2.

Figure 14:
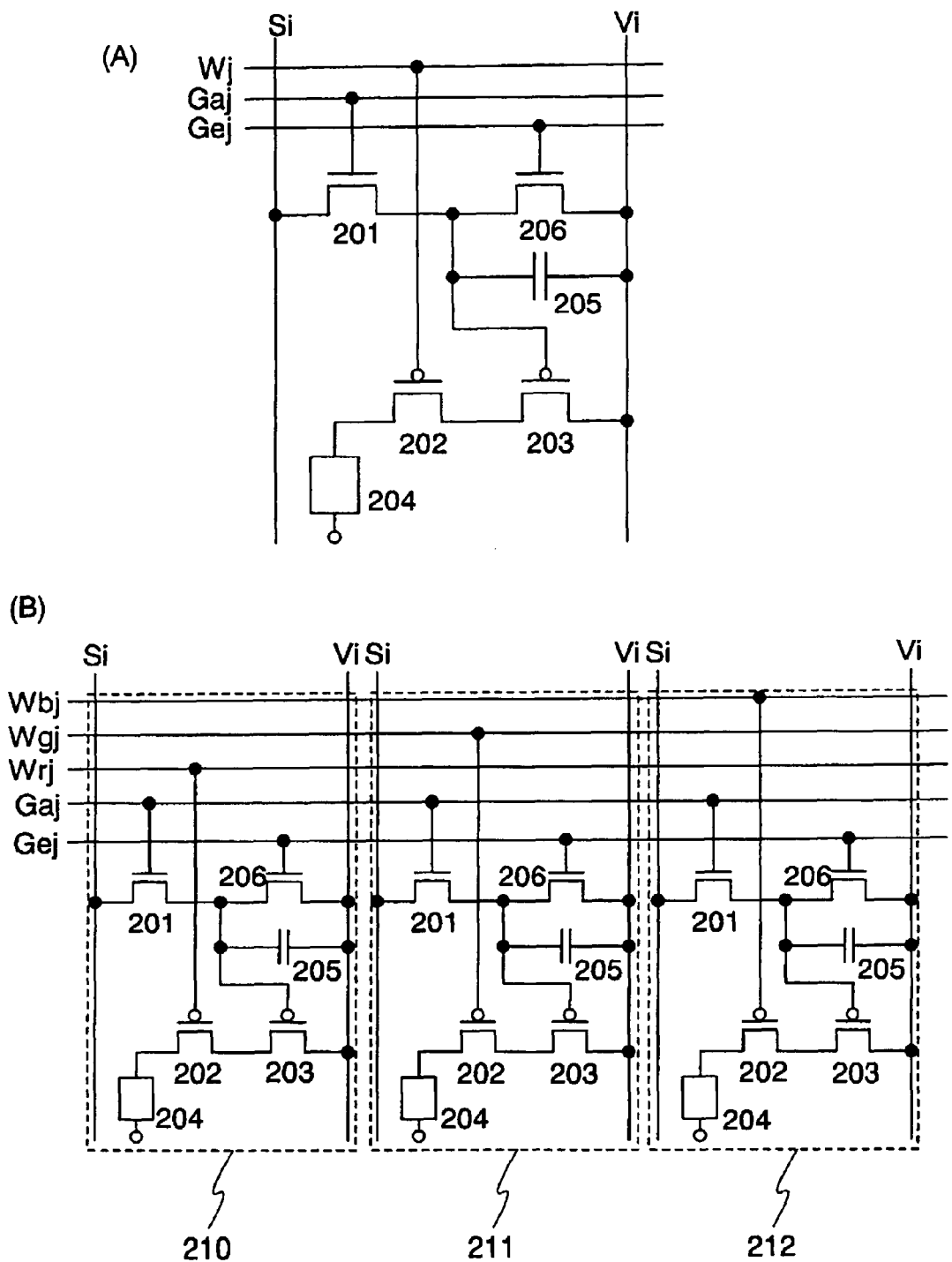
FIG. 14 is a diagram showing another embodiment of this invention.

A circuit diagram of the pixels of this example is shown in FIG. 14(A). The elements and the wirings shown in FIG. 2 are denoted by same reference numerals in FIG. 14(A). Note that the pixels using the first scan line Gaj (j=1 to y) and the second scan line Gej (j=1 to y) in common further use the second power line Wj (i=1 to x) in common. The second power line Wj (i=1 to x) intersects with the signal line Si (i=1 to x) and the first power line Vi (i=1 to x), and the pixels using the second scan line Gej (j=1 to y) in common has signal lines Si (i=1 to x) which are different from one another.

Shown in FIG. 14(B) is a pixel structure in the case of employing a method of adjusting a white balance by applying different voltages to the gates of the driving transistors 202 depending on a red pixel, a green pixel, and a blue pixel. Referring to FIG. 14(B), in a pixel 210 corresponding to red, a second power line Wrj for red (R) is connected to the gate of the driving transistor 202. In a pixel 211 corresponding to green, a second power line Wgj for green (G) is connected to the gate of the driving transistor 202. In a pixel 212 corresponding to blue, a power line Wbj for blue (B) is connected to the gate of the driving transistor 202.

Example 11

In this example, a pixel structure in the case of providing a resistance between a drain of the driving transistor 202 and a light-emitting element will be described using the pixels shown in FIGS. 14(A) and 14(B).

Figure 15:
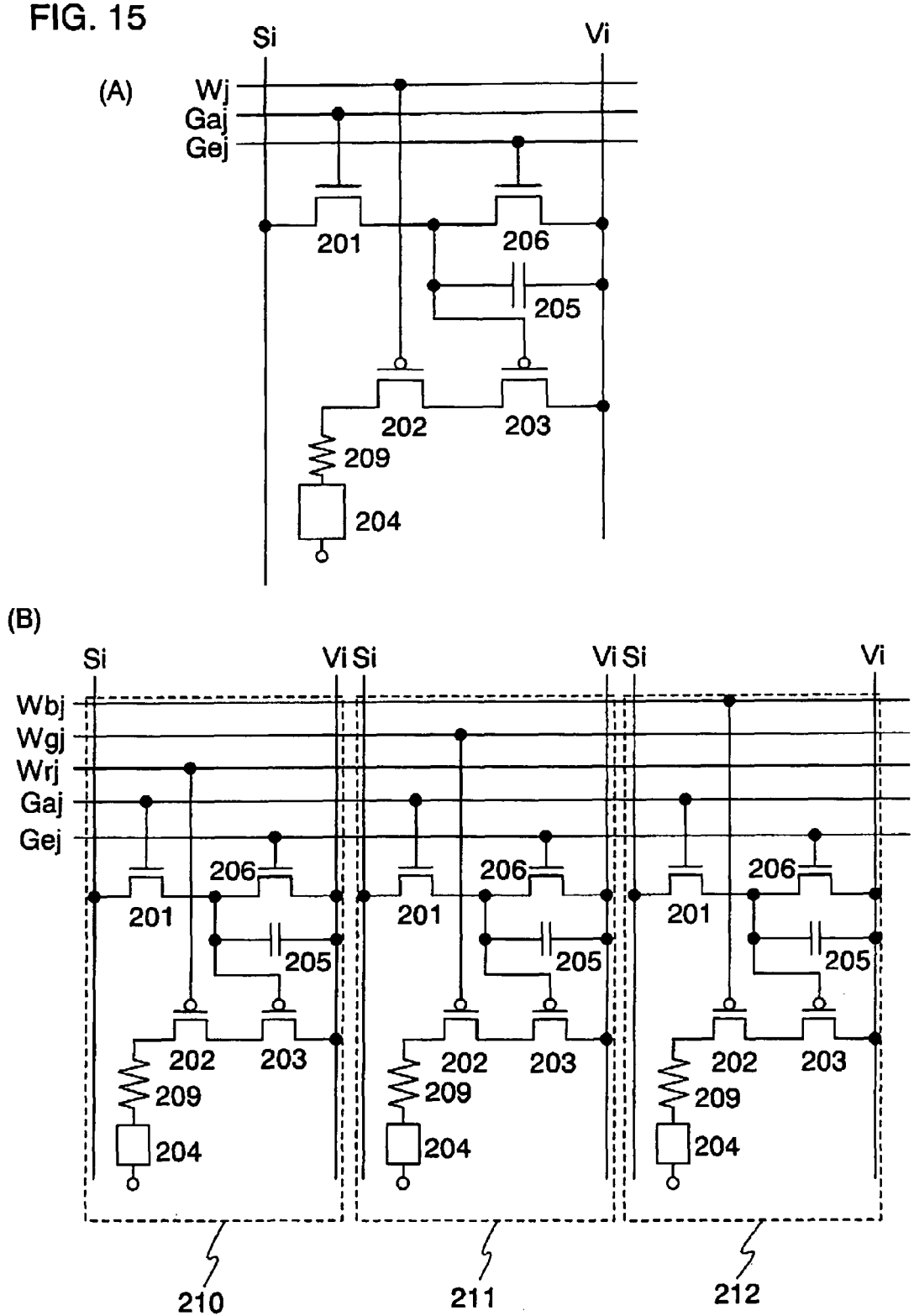
FIG. 15 is a diagram showing another embodiment of this invention.

Shown in FIG. 15(A) is the pixel structure in which the pixel shown in FIG. 14(A) is provided with a resistance. The elements and the wirings shown in FIG. 14(A) are denoted by the same reference numerals in FIG. 15(A). FIG. 15(A) is different from FIG. 14(A) in that a resistance 209 is provided between the pixel electrode of the light-emitting element 104 and the drain of the driving transistor 202.

Shown in FIG. 15(B) is a pixel structure in the case of employing a method of adjusting a white balance by applying different voltages to the gates of the driving transistors 202 depending on a red pixel, a green pixel, and a blue pixel. Referring to FIG. 15(B), in a pixel 210 corresponding to red, a second power line Wrj for red (R) is connected to the gate of the driving transistor 202. In a pixel 211 corresponding to green, a second power line Wgj for green (G) is connected to the gate of the driving transistor 202. In a pixel 212 corresponding to blue, a power line Wbj for blue (B) is connected to the gate of the driving transistor 202.

In the case of forming the pixel electrode by forming an electro-conductive film and then patterning the electro-conductive film, it is possible to prevent the driving transistor 202 from being destroyed due to a sharp change in potential of the drain of the driving transistor 202 caused by an electric charge charged on the electro-conductive film by using the resistance 209. Also, it is possible to use the resistance 5209 as an electrostatic countermeasure until a deposition of an EL.

Figure 16:
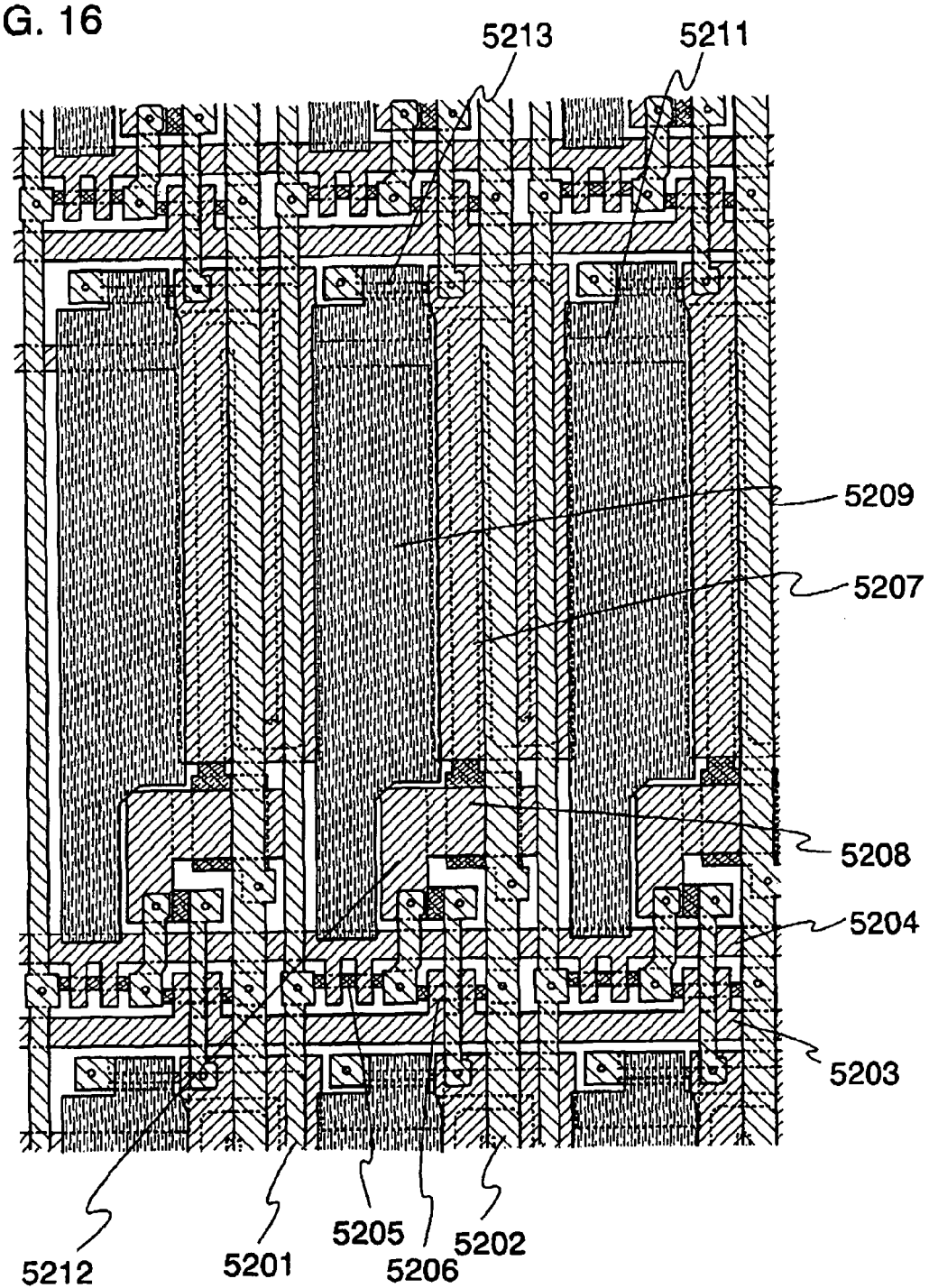
FIG. 16 is a diagram showing another example of the top view of this invention.

Next, one example of a top view of the pixel shown in FIG. 15(A) will be described. The top view of this example is shown in FIG. 16.

Denoted by 5201 is a signal line, denoted by 5202 is a first power line, denoted by 5211 is a second power line, denoted by 5204 is a first scan line, and denoted by 5203 is a second scan line. In this example, the signal line 5201, and the first power line 5202 are formed from an identical electro-conductive film, and the first scan line 5204, the second scan line 5203, and the second power line 5211 are formed from an identical electro-conductive film. Denoted by 5205 is a switching transistor, and a part of the first scan line 5204 functions as a gate electrode of the switching transistor 5205. Denoted by 5206 is an erasing transistor, and a part of the second scan line 5203 functions as a gate electrode of the erasing transistor 5206. Denoted by 5207 is a driving transistor, and denoted by 5208 is a current control transistor. Denoted by 5212 is a capacitance element, and denoted by 5213 is a resistance formed from a semiconductor film. The driving transistor 5207 has a wound active layer used for maintaining an L/W thereof at a value larger than that of the current control transistor 5208. For instance, the size of the driving transistor 5207 may be set to L=200 nm and W=4 nm, while the size of the current control transistor 5208 may be set to L=6 nm and W=12 nm. Denoted by 5209 is a pixel electrode, and light is emitted in an area (light-emitting area) where the pixel electrode 5209 overlaps with an electro-luminescent layer (not shown) and a cathode (not shown).

Figure 17:
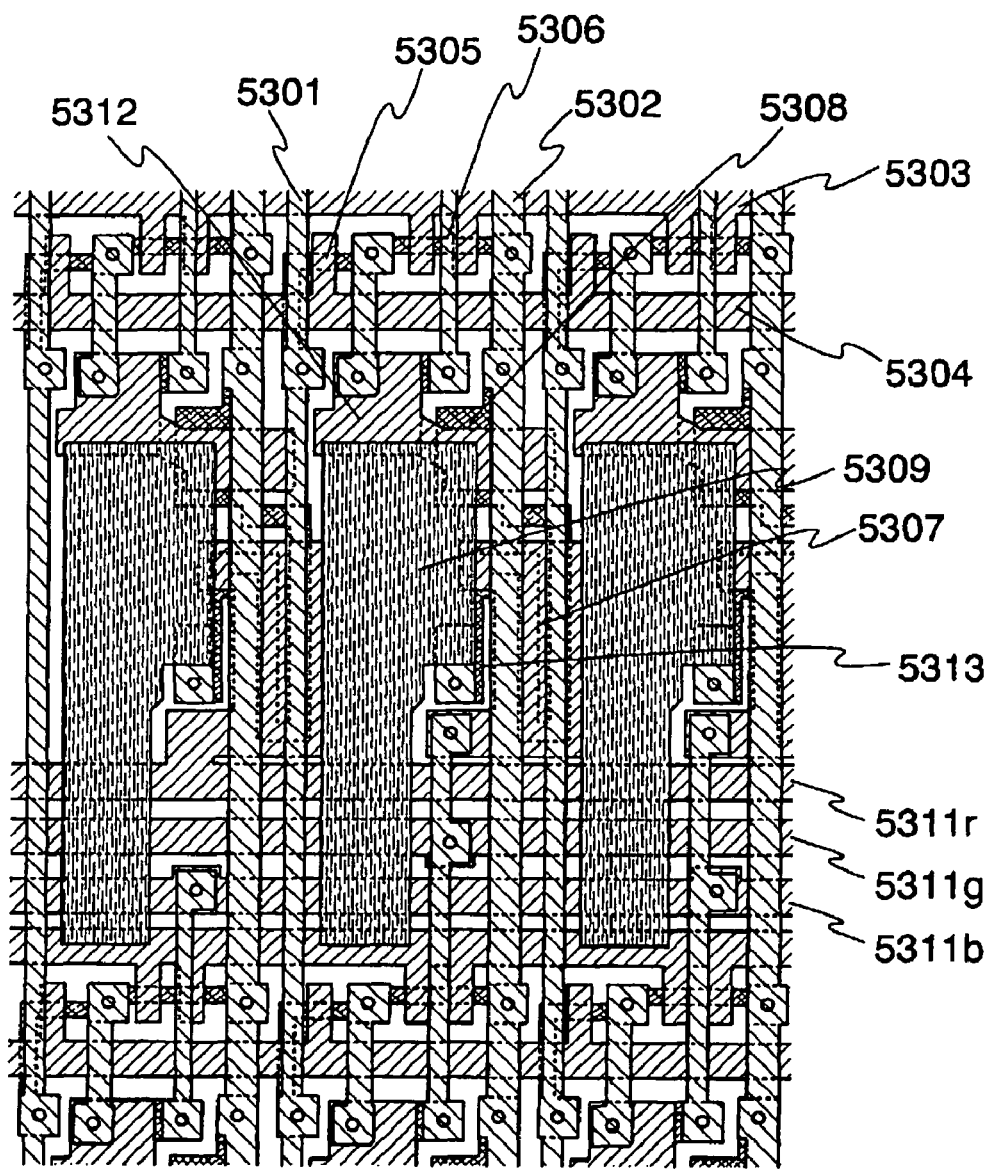
FIG. 17 is a diagram showing another example of the top view of this invention.

Next, one example of a top view of the pixel shown in FIG. 15(B) will be described. Shown in FIG. 17 is the pixel top view of this example.

Denoted by 5301 is a signal line, denoted by 5302 is a first power line, denoted by 5311r is a second power line corresponding to a red pixel, denoted by 5311g is a second power line corresponding to a green pixel, denoted by 5311b is a second power line corresponding to a blue pixel, denoted by 5304 is a first scan line, and denoted by 5303 is a second scan line. In this example, the signal line 5301 and the first power line 5302 are formed from an identical electro-conductive film, and the first scan line 5304, the second scan line 5303, and the second power lines 5311r, 5311g, 5311b are formed from an identical electro-conductive film. Denoted by 5305 is a switching transistor, and a part of the first scan line 5304 functions as a gate electrode of the switching transistor 5305. Denoted by 5306 is an erasing transistor, and a part of the second scan line 5303 functions as a gate electrode of the erasing transistor 5306. Denoted by 5307 is a driving transistor, and denoted by 5308 is a current control transistor. Denoted by 5312 is a capacitance element, and denoted by 5313 is a resistance formed from a semiconductor film. The driving transistor 5307 has a wound active layer used for maintaining an L/W thereof at a value larger than that of the current control transistor 5308. For instance, the size of the driving transistor 5307 may be set to L=200 nm and W=4 nm, while the size of the current control transistor 5308 may be set to L=6 nm and W=12 nm. Denoted by 5309 is a pixel electrode, and light is emitted in an area (light-emitting area) where the pixel electrode 5309 overlaps with an electro-luminescent layer (not shown) and a cathode (not shown).

It is needless to say that the top view of this invention is described only by way of example and that the invention is not limited thereto.

Since the number of transistors included in one pixel is 4 in the light-emitting device of this invention, it is possible to set a width across corner to 4 to 4.3 inches, a width of an interlayer used as a partition for separating adjacent light-emitting elements to 20 μm, a VGA to (640×480) 200 dpi, and the size of the pixel to 45×135 μm.

Example 12

Figure 18:
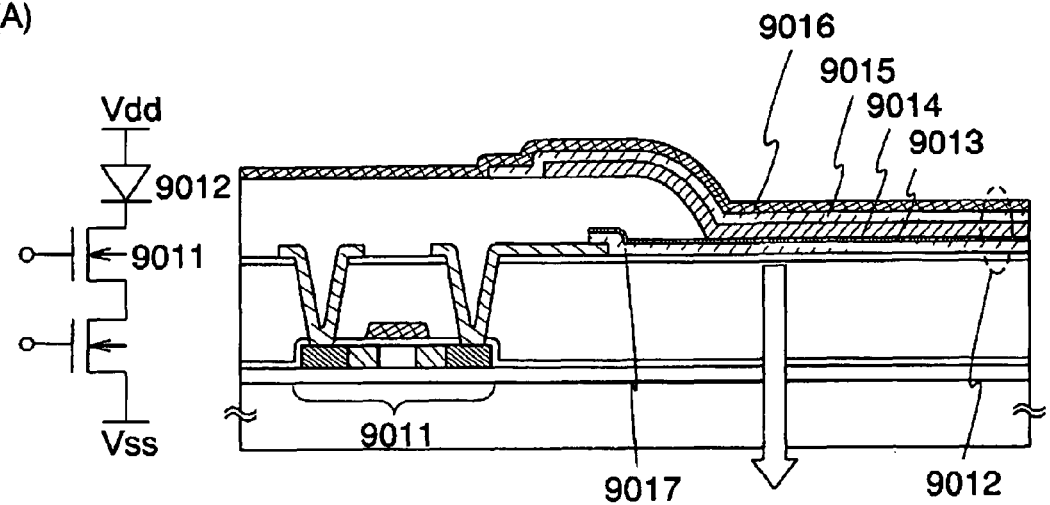
FIG. 18 is a diagram showing another example of the sectional structure of this invention.
Figure 18:
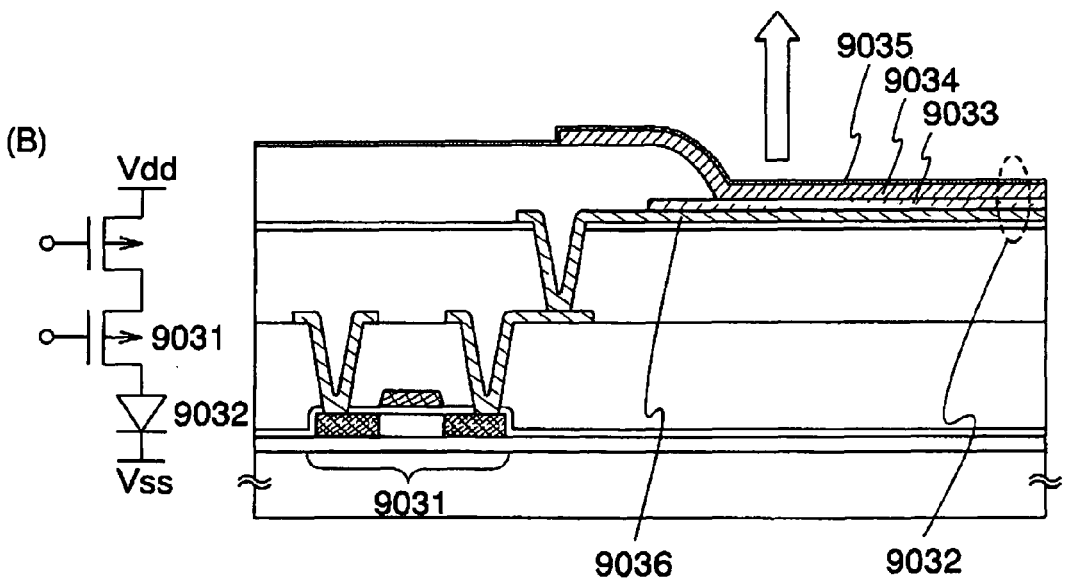

Shown in FIG. 18(A) is a sectional view of a pixel in the case where a driving transistor 9011 is of the N-type and light emitted from a light-emitting element 9012 is ejected in a direction of a cathode 9013. In FIG. 18(A), the cathode 9013 of the light-emitting element 9012 is formed on a transparent electro-conductive film 9017 electrically connected to a drain of the driving transistor 9011, and an electro-luminescent layer 9014 and an anode 9015 are formed on the cathode 9013 in this order. A shielding film 9016 for reflecting or shielding light is formed in such a manner as to cover the anode 9015. Any known material may be used for the cathode 9013 so far as it is an electro-conductive film having a small work function and reflecting light. Preferred examples of the material are Ca, Al, CaF, MgAg, AlLi, and the like. Note that a thickness of the cathode 9013 is regulated to a value which allows light to pass therethrough. For instance, an Al film having a thickness of 20 nm may be used as the cathode 9013. The electro-luminescent layer 9014 may be formed of either one of one layer or a stack of a plurality of layers. The anode 9015 is not required to transmit light, and a transparent electro-conductive film such as ITO, ITSO, IZO obtained by mixing indium oxide with 2 to 20% of zinc oxide (ZnO), Ti, or TiN may be used for the anode 9015. A metal reflecting light, for example, may be used as the shielding film 9016 without limitation thereto. A resin to which a black pigment is added may be used as the shielding film 9016, for example.

A portion at which the cathode 9013, the electro-luminescent layer 9014, and the anode 9015 are overlapped with one another corresponds to the light-emitting element 9012. In the case of the pixel shown in FIG. 18(A), the light emitted from the light-emitting element 9012 is ejected in a direction of the cathode 9013 as indicated by an white arrow.

Shown in FIG. 18(B) is a sectional view of a pixel in the case where a driving transistor 9031 is of the P-type and light emitted from the light-emitting element 9032 is ejected in a direction of a cathode 9035. Referring to FIG. 18(B), an anode 9033 of the light-emitting element 9032 is formed on a wiring 9036 electrically connected to a drain of the driving transistor 9031, and an electro-luminescent layer 9034 and the cathode 9035 are formed on the anode 9033 in this order. With such constitution, when light has passed through the anode 9033, the light is reflected by the wiring 9036. Any known material may be used for the cathode 9035 so far as it is an electro-conductive film having a small work function and reflecting light as is the case with FIG. 18(A). Note that a thickness of the cathode 9035 is regulated to a value which allows light to pass therethrough. For instance, an Al film having a thickness of 20 nm may be used as the cathode 9035. The electro-luminescent layer 9034 may be formed of either one of one layer or a stack of a plurality of layers, as is the case with FIG. 18(A). The anode 9033 is not required to transmit light, and a transparent electro-conductive film or Ti, or TiN may be used for the anode 9033 as is the case with FIG. 18(A).

A portion at which the anode 9033, the electro-luminescent layer 9034, and the cathode 9035 are overlapped with one another corresponds to the light-emitting element 9032. In the case of the pixel shown in FIG. 18(B), the light emitted from the light-emitting element 9032 is ejected in a direction of the cathode 9035 as indicated by an white arrow.

In addition, though the structure that the driving transistor is electrically connected to the light-emitting element is described in this example, a current control transistor may be connected between the driving transistor an the light-emitting element.

Example 13

In this example, a sectional structure of a pixel in the case where each of a driving transistor and a current control transistor is of a bottom gate type will be described.

The transistor to be used in this invention may be formed from amorphous silicon. Since the transistor formed from the amorphous silicon contributes to an elimination of a process of crystallization, it is possible to simplify a manufacturing method and to reduce a cost. Note that a P-type amorphous silicon transistor is suitably used for the pixel of this invention since it has a higher mobility as compared with an N-type amorphous silicon transistor. In this example, a sectional structure of a pixel in the case of using the N-type driving transistor will be described.

Figure 19:
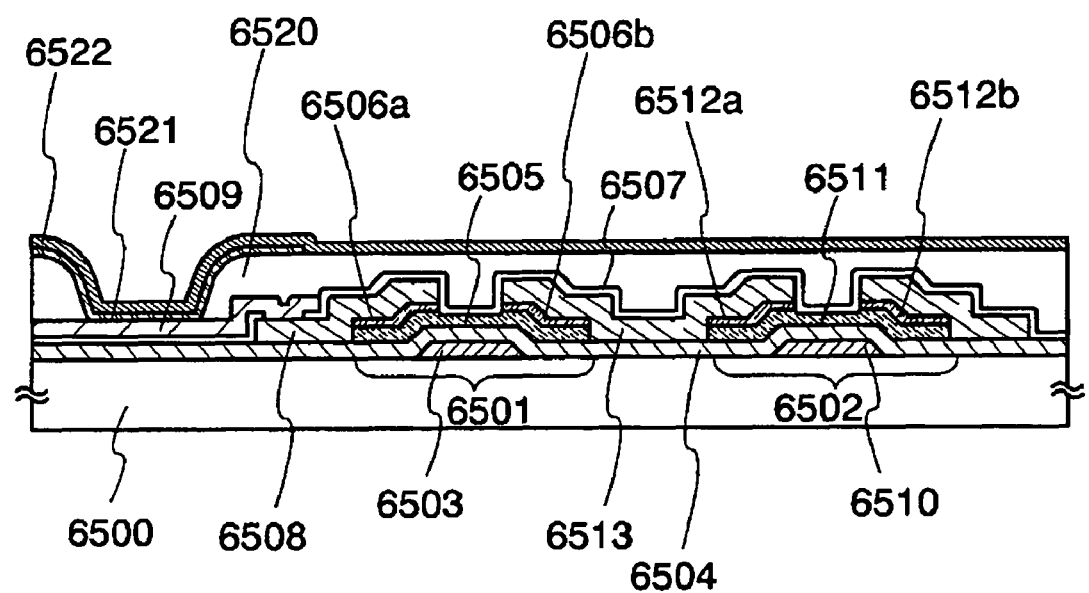
FIG. 19 is a diagram showing another example of the sectional structure of this invention.

Shown in FIG. 19(A) is a sectional view of a pixel of this example. Denoted by 6501 is a driving transistor and denoted by 6502 is a current control transistor. The driving transistor 6501 has a gate electrode 6503 formed on a substrate 6500 having an isolating surface, a gate insulating film 6504 formed on the substrate 6500 in such a manner as to cover the gate electrode 6503, and a semiconductor film 6505 formed at a position overlapping with the gate electrode 6503 with the gate insulating film being sandwiched therebetween. The semiconductor film 6505 has an impurity area 6506*a* and 6506*b* functioning as a source and a drain and having impurity for imparting an electro-conductivity. The impurity area 6506*a* is connected to a wiring 6508.

The current control transistor 6502 has, like the driving transistor 6501, a gate electrode 6510 formed on the substrate 6500 having the isolating surface, the gate insulating film 6504 formed on the substrate 6500 in such a manner as to cover the gate electrode 6510, and a semiconductor film 6511 formed at a position overlapping with the gate electrode 6510 with the gate insulating film 6504 being sandwiched therebetween. The semiconductor film 6511 has an impurity area 6512*a* and 6512*b* functioning as a source and a drain and having impurity for imparting electro-conductivity. The impurity area 6512*a* is connected, via a wiring 6513, to the impurity area 6506*b* included in the driving transistor 6501.

The driving transistor 6501 and the current control transistor 6502 are covered with a protection film 6507 formed from an insulating film. The wiring 6508 is connected to an anode 6509 via a contact hall formed on the protection film 6507. The driving transistor 6501, the current control transistor 6502, and the protection film 6507 are covered with an interlayer insulating film 6520. The interlayer insulating film 6520 has an opening, and the anode 6509 is exposed in the opening. An electro-luminescent layer 6521 and a cathode 6522 are formed on the anode 6509.

In addition, the example in which the driving transistor and the current control transistor are of the N-type is described with reference to FIG. 19(A), they may be of the P-type. In this case, P-type impurity is used for controlling a threshold value of the driving transistor.

Example 14

Figure 20:
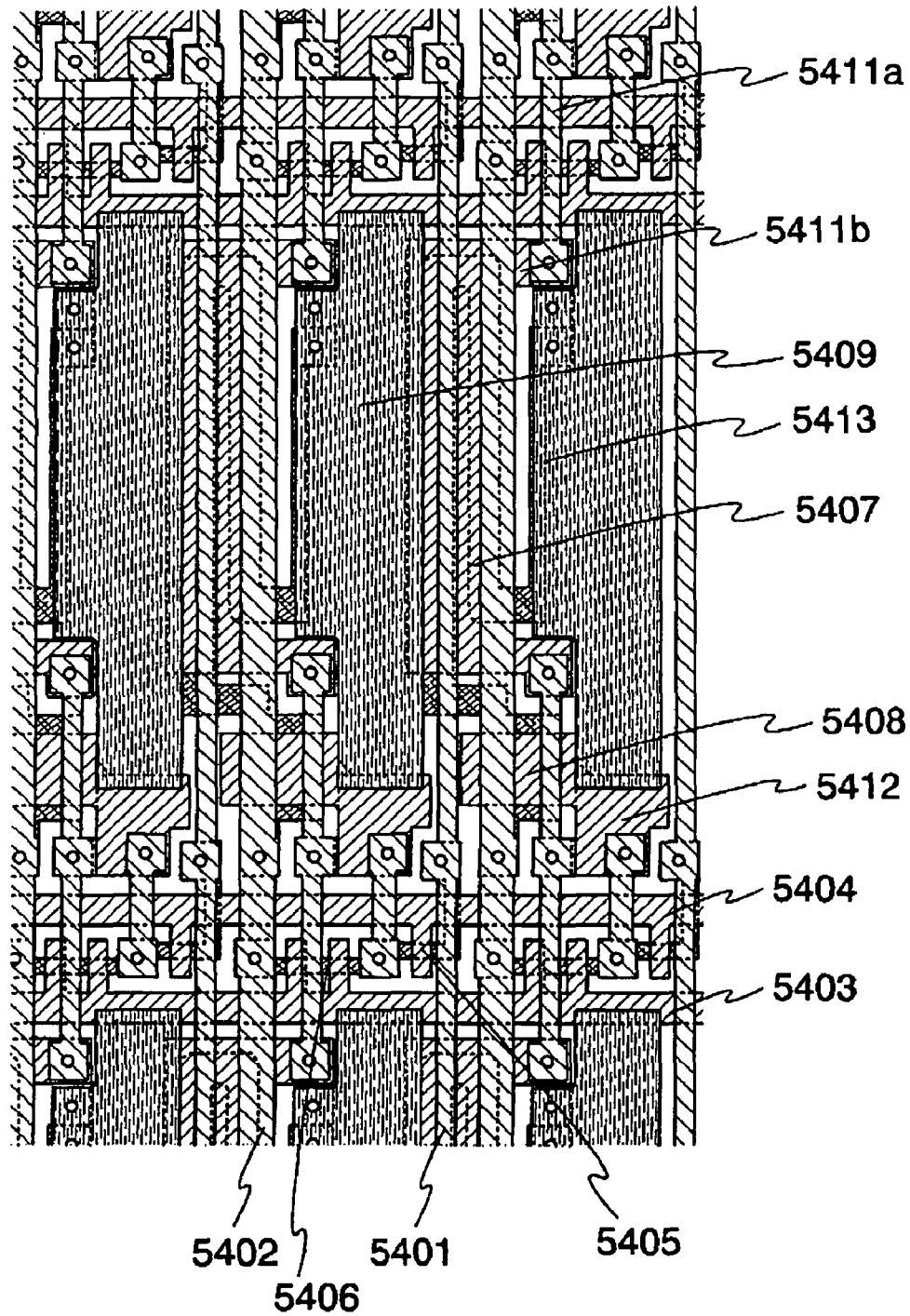
FIG. 20 is a diagram showing another example of the top view of this invention.

In this example, one example of a top view of the pixel shown in FIG. 2 will be described. The pixel top view of this example is shown in FIG. 20.

Denoted by 5401 is a signal line, denoted by 5402 is a first power line, denoted by 5411*a* and 5411*b* are second power lines, denoted by 5404 is a first scan line, and denoted by 5403 is a second scan line. In this example, the signal line 5401, the first power line 5402, and the second power line 5411*a* are formed from an identical electro-conductive film, and the first scan line 5404, the second scan line 5403, and the second power line 5411*b* are formed from an identical electro-conductive film. Denoted by 5405 is a switching transistor, and a part of the first scan line 5404 functions as a gate electrode of the switching transistor 5405. Denoted by 5406 is an erasing transistor, and a part of the second scan line 5403 functions as a gate electrode of the erasing transistor 5406. Denoted by 5407 is a driving transistor, and denoted by 5408 is a current control transistor. Denoted by 5412 is a capacitance element, and denoted by 5413 is a resistance formed from a semiconductor film. The driving transistor 5407 has a wound active layer used for maintaining an L/W thereof at a value larger than that of the current control transistor 5408. For instance, the size of the driving transistor 5407 may be set to L=200 nm and W=4 nm, while the size of the current control transistor 5408 may be set to L=6 nm and W=12 nm. Denoted by 5409 is a pixel electrode, and light is emitted in an area (light-emitting area) 5410 where the pixel electrode 5409 overlaps with an electro-luminescent layer (not shown) and a cathode (not shown).

It is needless to say that the top view of this invention is described only by way of example and that the invention is not limited thereto.

The invention claimed is:

1. A light-emitting device comprising:
   a pixel comprising:
     a light-emitting element,
     a first transistor for determining a value of a current flowing to the light-emitting element,
     a second transistor for determining a light emission or non light emission of the light-emitting element depending on a video signal input through a signal line,
     a third transistor for controlling an input of the video signal, and
     a fourth transistor for forcing the light-emitting element into a non-emission state irrelevant from the video signal,
   wherein the light-emitting element, the first transistor, and the second transistor are connected in series between a first power line and a counter electrode of the light-emitting element,
   wherein a source of the first transistor is connected to the first power line and a gate electrode of the first transistor is connected to a second power line so that a voltage between the gate electrode and the source of the first transistor is constantly fixed,
   wherein the first transistor has a channel length longer than a channel width, and the second transistor has a channel length equal to or shorter than a channel width, and
   wherein a ratio of the channel length to the channel width of the first transistor is 5 or more.

2. The light-emitting device according to claim 1, wherein the first transistor and the second transistor are identical in conductivity.

3. The light-emitting device according to claim 1, wherein the first transistor is a depletion type transistor.

4. The light-emitting device according to claim 1, wherein the light-emitting device is incorporated into at least one selected from the group consisting of a cellular phone, a mobile computer, a game machine, an electronic book, a video camera, a digital camera, a goggle display, a display device, and a navigation system.

5. The light-emitting device according to claim 1, wherein an electric potential of the second power line is fixed.

6. The light-emitting device according to claim 1, wherein the signal line, the first power line, and the second power line are provided in parallel with each other, and the first power line is provided between the signal line and the second power line.

7. The light-emitting device according to claim 1, wherein the second power line has an electric potential so that the first transistor operates in a saturation region when the second transistor is in an on-state.

8. A light-emitting device comprising:
a pixel comprising:
  a light-emitting element,
  a first transistor for determining a value of a current flowing to the light-emitting element, and
  a second transistor for determining a light emission or non light emission of the light-emitting element depending on a video signal input through a signal line,
wherein the light-emitting element, the first transistor, and the second transistor are connected in series between a first power line and a counter electrode of the light-emitting element,
wherein a source of the first transistor is connected to the first power line and a gate electrode of the first transistor is connected to a second power line so that a voltage between the gate electrode and the source of the first transistor is constantly fixed,
wherein the first transistor has a channel length longer than a channel width, and the second transistor has a channel length equal to or shorter than a channel width, and
wherein a ratio of the channel length to the channel width of the first transistor is 5 or more.

9. A light-emitting device comprising:
a pixel comprising:
  a light-emitting element,
  a first transistor for determining a value of a current flowing to the light-emitting element,
  a second transistor for determining a light emission or non light emission of the light-emitting element depending on a video signal input through a signal line, and
  a third transistor for controlling an input of the video signal,
wherein the light-emitting element, the first transistor, and the second transistor are connected in series between a first power line and a counter electrode of the light-emitting element,
wherein a source of the first transistor is connected to the first power line and a gate electrode of the first transistor is connected to a second power line so that a voltage between the gate electrode and the source of the first transistor is constantly fixed,
wherein the first transistor has a channel length longer than a channel width, and the second transistor has a channel length equal to or shorter than a channel width, and
wherein a ratio of the channel length to the channel width of the first transistor is 5 or more.

10. An element substrate comprising:
a pixel comprising:
  a pixel electrode;
  a first transistor for determining a value of a current flowing to the pixel electrode, and
  a second transistor for determining a supply or non-supply of the current to the pixel electrode depending on a video signal input through a signal line,
wherein the first transistor and the second transistor are connected in series between a first power line and the pixel electrode,
wherein a source of the first transistor is connected to the first power line and a gate electrode of the first transistor is connected to a second power line so that a voltage between the gate electrode and the source of the first transistor is constantly fixed,
wherein the first transistor has a channel length longer than a channel width, and the second transistor has a channel length equal to or shorter than a channel width, and
wherein a ratio of the channel length to the channel width of the first transistor is 5 or more.

11. The light-emitting device according to claim 8, wherein the first transistor and the second transistor are identical in conductivity.

12. The light-emitting device according to claim 8, wherein the first transistor comprises a depletion type transistor.

13. The light-emitting device according to claim 8, wherein the light-emitting device is incorporated into at least one selected from the group consisting of a cellular phone, a mobile computer, a game machine, an electronic book, a video camera, a digital camera, a goggle display, a display device, and a navigation system.

14. The light-emitting device according to claim 8, wherein the signal line, the first power line, and the second power line are provided in parallel with each other, and the first power line is provided between the signal line and the second power line.

15. The light-emitting device according to claim 8, wherein the second power line has an electric potential so that the first transistor operates in a saturation region when the second transistor is in an on-state.

16. The light-emitting device according to claim 9, wherein the first transistor and the second transistor are identical in conductivity.

17. The light-emitting device according to claim 9, wherein the first transistor comprises a depletion type transistor.

18. The light-emitting device according to claim 9, wherein the light-emitting device is incorporated into at least one selected from the group consisting of a cellular phone, a mobile computer, a game machine, an electronic book, a video camera, a digital camera, a goggle display, a display device, and a navigation system.

19. The light-emitting device according to claim 9, wherein the signal line, the first power line, and the second power line are provided in parallel with each other, and the first power line is provided between the signal line and the second power line.

20. The light-emitting device according to claim 9, wherein the second power line has an electric potential so that the first transistor operates in a saturation region when the second transistor is in an on-state.

21. The element substrate according to claim 10, wherein each of the first transistor and the second transistor has a P-type conductivity, and a threshold value of the first transistor is higher than that of the second transistor.

22. The element substrate according to claim 10, wherein each of the first transistor and the second transistor has an N-type conductivity, and a threshold value of the first transistor is lower than that of the second transistor.

23. The element substrate according to claim 10, wherein the first transistor comprises a depletion type transistor.

24. The element substrate according to claim 10, wherein the element substrate is incorporated into at least one selected from the group consisting of a cellular phone, a mobile computer, a game machine, an electronic book, a video camera, a digital camera, a goggle display, a display device, and a navigation system.

25. The element substrate according to claim 10, wherein the signal line, the first power line, and the second power line are provided in parallel with each other, and the first power line is provided between the signal line and the second power line.

26. The element substrate according to claim 10, wherein the second power line has an electric potential so that the first transistor operates in a saturation region when the second transistor is in an on-state.

27. An element substrate comprising:
a first power line;
a second power line;
a scan line;
a signal line;
a pixel electrode;
a first transistor;
a second transistor; and
a third transistor,
wherein one of a source and a drain of the first transistor is connected to the pixel electrode,
wherein one of a source and a drain of the second transistor is connected to the other of the source and the drain of the first transistor,
wherein the other of the source and the drain of the second transistor is connected to the first power line,
wherein a gate electrode of the first transistor is connected to the second power line,
wherein one of a source and a drain of the third transistor is connected to a gate electrode of the second transistor,
wherein the other of the source and the drain of the third transistor is connected to the signal line,
wherein a gate electrode of the third transistor is connected to the scan line,
wherein the first transistor has a channel length longer than a channel width, and the second transistor has a channel length equal to or shorter than a channel width, and
wherein a ratio of the channel length to the channel width of the first transistor is 5 or more.

28. The element substrate according to claim 27, wherein the first transistor and the second transistor are identical in conductivity.

29. The element substrate according to claim 27, wherein the first transistor is a depletion type transistor.

30. The element substrate according to claim 27, wherein the element substrate is incorporated into at least one selected from the group consisting of a cellular phone, a mobile computer, a game machine, an electronic book, a video camera, a digital camera, a goggle display, a display device, and a navigation system.

31. The element substrate according to claim 27, wherein the electric potential of a second power line is fixed.

32. The element substrate according to claim 27, wherein the scan line and the second power line are provided in parallel with each other.

33. The element substrate according to claim 27, wherein the second power line has an electric potential so that the first transistor operates in a saturation region when the second transistor is in an on-state.

34. The element substrate according to claim 27, wherein the one of the source and the drain of the first transistor is connected to the pixel electrode via a resistor.

35. An element substrate comprising:
a first power line;
a second power line;
a scan line;
a signal line;
a pixel electrode;
a first transistor;
a second transistor; and
a third transistor,
wherein one of a source and a drain of the first transistor is connected to the first power line,
wherein one of a source and a drain of the second transistor is connected to the other of the source and the drain of the first transistor,
wherein the other of the source and the drain of the second transistor is connected to the pixel electrode,
wherein a gate electrode of the first transistor is connected to the second power line,
wherein one of a source and a drain of the third transistor is connected to a gate electrode of the second transistor,
wherein the other of the source and the drain of the third transistor is connected to the signal line,
wherein a gate electrode of the third transistor is connected to the scan line,
wherein the first transistor has a channel length longer than a channel width, and the second transistor has a channel length equal to or shorter than a channel width, and
wherein a ratio of the channel length to the channel width of the first transistor is 5 or more.

36. The element substrate according to claim 35, wherein the first transistor and the second transistor are identical in conductivity.

37. The element substrate according to claim 35, wherein the first transistor is a depletion type transistor.

38. The element substrate according to claim 35, wherein the element substrate is incorporated into at least one selected from the group consisting of a cellular phone, a mobile computer, a game machine, an electronic book, a video camera, a digital camera, a goggle display, a display device, and a navigation system.

39. The element substrate according to claim 35, wherein the electric potential of a second power line is fixed.

40. The element substrate according to claim 35, wherein the second power line has an electric potential so that the first transistor operates in a saturation region when the second transistor is in an on-state.

41. The element substrate according to claim 35, wherein the other of the source and the drain of the second transistor is connected to the pixel electrode via a resistor.

* * * * *